(12) United States Patent
Bang et al.

(10) Patent No.: US 12,200,955 B2
(45) Date of Patent: Jan. 14, 2025

(54) DISPLAY DEVICE INCLUDING VALLEY SEPARATED CIRCUIT PORTIONS

(71) Applicant: Samsung Display Co., Ltd., Yongin-si (KR)

(72) Inventors: Kiho Bang, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/324,014

(22) Filed: May 25, 2023

(65) Prior Publication Data

US 2023/0329032 A1    Oct. 12, 2023

Related U.S. Application Data

(63) Continuation of application No. 17/011,252, filed on Sep. 3, 2020, now Pat. No. 11,706,942.

(30) Foreign Application Priority Data

Feb. 17, 2020    (KR) ........................ 10-2020-0019079

(51) Int. Cl.
*H10K 50/84* (2023.01)
*H10K 50/844* (2023.01)
(Continued)

(52) U.S. Cl.
CPC ......... *H10K 50/841* (2023.02); *H10K 50/844* (2023.02); *H10K 59/122* (2023.02);
(Continued)

(58) Field of Classification Search
CPC .... H10K 50/841; H10K 50/844; H10K 50/15; H10K 50/16; H10K 50/17; H10K 50/171;
(Continued)

(56) References Cited

U.S. PATENT DOCUMENTS 8,963,137 B2    2/2015  Lee et al.
9,818,807 B2    11/2017 Park
(Continued)

FOREIGN PATENT DOCUMENTS

CN    108695365 A    10/2018
CN    109802048 A    5/2019
(Continued)

*Primary Examiner* — Ida M Soward
(74) *Attorney, Agent, or Firm* — Lewis Roca Rothgerber Christie LLP

(57) ABSTRACT

A display device includes: a substrate including a display area and a non-display area; a circuit portion including a first circuit portion and a second circuit portion on the non-display area; a valley portion separating the first circuit portion and the second circuit portion from each other; and a thin film encapsulation layer sealing the display area, the thin film encapsulation layer extending from the display area to the valley portion, and the first circuit portion is between the valley portion and the display area, the second circuit portion is at an outside of the valley portion, an internal layer on the first circuit portion includes a plurality of island portions that are apart from one another in a first direction and a second direction crossing the first direction, and an external layer on the second circuit portion includes at least one groove extending in the first direction.

19 Claims, 15 Drawing Sheets

(51) Int. Cl.
  *H10K 59/12* (2023.01)
  *H10K 59/122* (2023.01)
  *H10K 59/40* (2023.01)
  *G02F 1/1335* (2006.01)
  *G02F 1/1362* (2006.01)
  *G09G 3/3266* (2016.01)
  *G09G 3/3275* (2016.01)
  *G09G 3/3283* (2016.01)
  *G09G 3/3291* (2016.01)
  *H01L 27/146* (2006.01)
  *H10K 50/15* (2023.01)
  *H10K 50/16* (2023.01)
  *H10K 50/17* (2023.01)
  *H10K 50/816* (2023.01)
  *H10K 50/828* (2023.01)
  *H10K 59/35* (2023.01)
  *H10K 102/00* (2023.01)

(52) U.S. Cl.
  CPC ....... *H10K 59/40* (2023.02); *G02F 1/133512* (2013.01); *G02F 1/133514* (2013.01); *G02F 1/133528* (2013.01); *G02F 1/136209* (2013.01); *G09G 3/3266* (2013.01); *G09G 3/3275* (2013.01); *G09G 3/3283* (2013.01); *G09G 3/3291* (2013.01); *G09G 2300/0408* (2013.01); *H01L 27/14678* (2013.01); *H05K 2201/09909* (2013.01); *H10K 50/15* (2023.02); *H10K 50/16* (2023.02); *H10K 50/17* (2023.02); *H10K 50/171* (2023.02); *H10K 50/816* (2023.02); *H10K 50/828* (2023.02); *H10K 59/35* (2023.02); *H10K 59/351* (2023.02); *H10K 2102/00* (2023.02)

(58) Field of Classification Search
  CPC ............ H10K 50/816; H10K 50/828; H10K 50/8428; H10K 59/122; H10K 59/40; H10K 59/35; H10K 59/351; H10K 59/124; H10K 59/131; H10K 59/1216; H10K 59/123; H10K 59/38; H10K 59/1213; H10K 59/1315; H10K 59/12; H10K 2102/00; G02F 1/133512; G02F 1/133514; G02F 1/133528; G02F 1/136209; G09G 3/3266; G09G 3/3275; G09G 3/3283; G09G 3/3291; G09G 2300/0408; H01L 27/14678; H05K 2201/09909

See application file for complete search history.

(56) References Cited

U.S. PATENT DOCUMENTS

| | | | |
|---|---|---|---|
| 10,170,534 B1* | 1/2019 | Kim | .................. H01L 27/1248 |
| 2016/0307971 A1 | 10/2016 | Jeon | |
| 2017/0033312 A1 | 2/2017 | Kim et al. | |
| 2017/0278912 A1* | 9/2017 | Kim | .................. H10K 59/8722 |
| 2017/0279079 A1* | 9/2017 | Kim | .................. H10K 59/124 |
| 2017/0345881 A1 | 11/2017 | Kim et al. | |
| 2018/0033830 A1 | 2/2018 | Kim et al. | |
| 2018/0124933 A1 | 5/2018 | Park et al. | |
| 2018/0158894 A1 | 6/2018 | Park et al. | |
| 2018/0287093 A1* | 10/2018 | Lee | .................. H10K 59/122 |
| 2019/0057632 A1 | 2/2019 | Kim et al. | |
| 2019/0148469 A1 | 5/2019 | Lhee et al. | |
| 2019/0207157 A1 | 7/2019 | Gong et al. | |
| 2019/0237533 A1* | 8/2019 | Kim | .................. H10K 50/8426 |
| 2019/0237690 A1 | 8/2019 | Park et al. | |
| 2019/0305072 A1* | 10/2019 | Park | .................. G09G 3/3233 |
| 2020/0006697 A1 | 1/2020 | Jung | |
| 2020/0176538 A1 | 6/2020 | Um et al. | |
| 2020/0194534 A1 | 6/2020 | Park et al. | |
| 2020/0212115 A1 | 7/2020 | Choi et al. | |
| 2021/0225994 A1 | 7/2021 | Long et al. | |
| 2022/0140026 A1 | 5/2022 | Lhee et al. | |

FOREIGN PATENT DOCUMENTS

| | | |
|---|---|---|
| CN | 110098223 A | 8/2019 |
| KR | 10-2013-0025806 A | 3/2013 |
| KR | 10-2016-0087982 A | 7/2016 |
| KR | 10-2018-0014398 A | 2/2018 |
| KR | 10-2018-0048247 A | 5/2018 |
| KR | 10-2018-0112171 A | 10/2018 |
| KR | 10-2019-0093228 A | 8/2019 |

* cited by examiner

DISPLAY DEVICE INCLUDING VALLEY SEPARATED CIRCUIT PORTIONS

CROSS-REFERENCE TO RELATED APPLICATIONS

This application is a continuation of U.S. patent application Ser. No. 17/011,252, filed on Sep. 3, 2020, which claims priority to and the benefit of Korean Patent Application No. 10-2020-0019079, filed on Feb. 17, 2020 in the Korean Intellectual Property Office, the entire disclosures of both of which are incorporated herein by reference.

BACKGROUND

1. Field

Aspects of one or more embodiments relate to a display device.

2. Description of Related Art

As the information society has developed, demand for a display device that displays images has been increasing in various forms. The field of display devices has rapidly changed to a thin, light, and large-sized flat panel display device (FPD), which substitutes for a cathode ray tube (CRT) having a large volume. Examples of the flat panel display device include a liquid crystal display (LCD) device, a plasma display panel (PDP), an organic light-emitting display device (OLED), an electrophoretic display device (EPD), etc.

Such display devices may include a display area for realizing images and a non-display area not realizing images. Recently, research has been actively conducted into an increase of a display area by reducing an area of a non-display area, in which circuit units, etc. of a display device are arranged.

In addition, a display device may include a thin film encapsulation layer for sealing a display area, and the thin film encapsulation layer may include at least one inorganic encapsulation layer and at least one organic encapsulation layer.

SUMMARY

Aspects of one or more embodiments relate to a display device including a thin film encapsulation layer. According to an aspect of one or more embodiments, a display device in which overflow of an organic encapsulation layer may be prevented or checked is provided.

According to an aspect of one or more embodiments, a display device, in which at least one groove for preventing or checking overflow of an organic encapsulation layer is on a circuit unit of a non-display area to reduce an area of the non-display area and to expand a display area, is provided.

Additional aspects will be set forth, in part, in the description which follows and, in part, will be apparent from the description, or may be learned by practice of the presented embodiments of the disclosure.

According to one or more embodiments, a display device includes: a substrate including a display area and a non-display area; a circuit portion on the non-display area, the circuit portion including a first circuit portion and a second circuit portion; a valley portion separating the first circuit portion and the second circuit portion from each other; and a thin film encapsulation layer sealing the display area, the thin film encapsulation layer extending from the display area to the valley portion, wherein the first circuit portion is between the valley portion and the display area, the second circuit portion is on an outside of the valley portion, an internal layer on the first circuit portion includes a plurality of island portions that are apart from one another in a first direction and a second direction crossing the first direction, and an external layer on the second circuit portion includes at least one groove extending in the first direction.

The display device may further include display elements on the display area and including a pixel electrode and an opposite electrode; and a connecting conductive layer including a same material as a material in the pixel electrode and extending from the first circuit portion to the second circuit portion, and the connecting conductive layer may include a plurality of holes.

The external layer may cover the plurality of holes.

The external layer may be divided into a plurality of pattern portions by the at least one groove, and the plurality of pattern portions may cover the plurality of holes.

The external layer may include a same material as a material of a pixel defining layer, the pixel defining layer defining an emission area of the display elements and covering edges of the pixel electrode, and an upper external layer may be located on the external layer.

The internal layer and the external layer may be separated from each other by the valley portion.

A first external insulating layer may be between the second circuit portion and the external layer.

A second external insulating layer may be between the first external insulating layer and the external layer.

A third external insulating layer may be between the second external insulating layer and the external layer.

The display device may further include a dam portion around the valley portion.

The dam portion may include a plurality of dams, and the plurality of dams may extend in the second direction.

The at least one groove of the external layer may surround the valley portion.

The thin film encapsulation layer may include at least one inorganic encapsulation layer and at least one organic encapsulation layer.

The display device may further include an input sensor on the thin film encapsulation layer.

The input sensor may include a touch wiring on the non-display area.

According to one or more embodiments, a display device includes: a substrate including a display area and a non-display area; a valley portion around the display area in the non-display area, the valley portion including a first valley area and a second valley area facing each other; a circuit portion at an outside of at least one of the first valley area and the second valley area, the circuit portion extending in a first direction; an external layer including at least one groove extending in the first direction on the circuit portion; a plurality of dams at an outside of the valley portion between the first valley area and the second valley area of the valley portion, the plurality of dams extending in a second direction crossing the first direction; and a thin film encapsulation layer sealing the display area, the thin film encapsulation layer extending to the non-display area.

The display device may further include display elements on the display area and including a pixel electrode and an opposite electrode; and a connecting conductive layer on the circuit portion and including a same material as a material of the pixel electrode, and the connecting conductive layer may include a plurality of holes.

The external layer may cover the plurality of holes.

The external layer may be divided into a plurality of pattern portions by the at least one groove.

The plurality of pattern portions may cover the plurality of holes.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
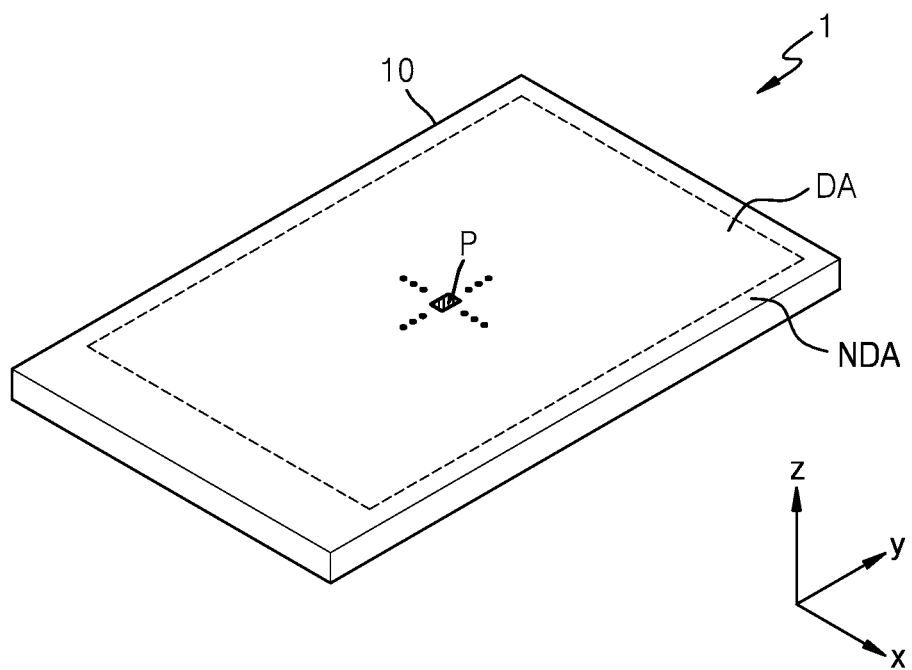
FIG. 1 is a perspective view of a display device according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Some example embodiments will be described below in further detail with reference to the accompanying drawings. Those components that are the same or similar are rendered the same reference numeral regardless of the figure number, and redundant explanations may be omitted.

While such terms as "first," "second," etc., may be used to describe various components, such components are not be limited to the above terms. The above terms are used to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments described below, when layers, areas, elements, or the like are referred to as being "connected," it is to be understood that they may be directly connected or one or more intervening portions may be present between layers, areas, elements, or the like. For example, when layers, areas, elements, or the like are referred to as being "electrically connected," they may be directly electrically connected, or layers, areas, elements, or the like may be indirectly electrically connected and one or more intervening portions may be present.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

A display device is a device for displaying images, and may include a mobile device that is portable, for example, a game console, a multimedia device, and an ultra-small PC. The display device that will be described herein may include a liquid crystal display, an electrophoretic display, an organic light-emitting display, an inorganic light-emitting display, a field emission display, a surface-conduction electron-emitter display, a quantum dot display, a plasma display, a cathode ray display, etc. Herein, according to one or more embodiments, it is described that the display device is an organic light-emitting display device, but the display device of the disclosure is not limited thereto; that is, various types of display devices as mentioned above may be used.

Figure 2:
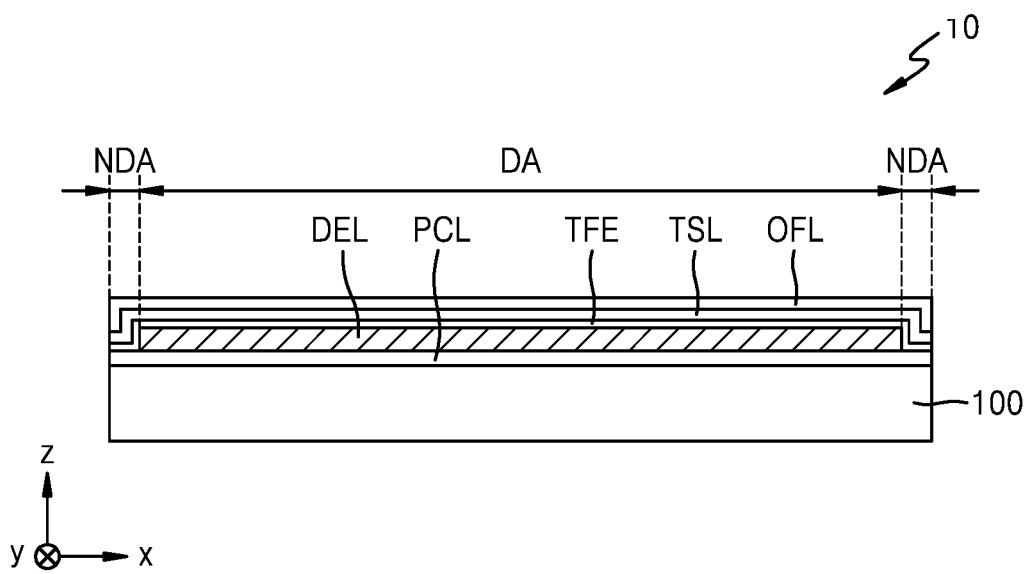
FIG. 2 is a cross-sectional view of a display panel according to an embodiment.

FIG. 1 is a perspective view of a display device 1 according to an embodiment; and FIG. 2 is a cross-sectional view of a display panel 10 according to an embodiment.

Referring to FIG. 1, the display device 1 may include the display panel 10 for realizing images. The display panel 10 includes a display area DA, in which pixels P are arranged to realize images, and a non-display area NDA that does not display images. A circuit unit including at least one thin film transistor, etc. may be on the non-display area NDA. The display panel 10 may provide images by using light emitted from a plurality of pixels P in the display area DA. In an embodiment, each of the pixels P may emit red light, green light, blue light, or white light.

Referring to FIG. 2, the display panel 10 may include a pixel circuit layer PCL on a substrate 100, and a display element layer DEL on the pixel circuit layer PCL, wherein the pixel circuit layer PCL includes a pixel circuit and insulating layers and the display element layer DEL includes a plurality of display elements.

The substrate 100 may include glass or a polymer resin, such as polyethersulfone, polyarylate, polyetherimide, polyethylene naphthalate, polyethylene terephthalate, polyphenylene sulfide, polyimide, polycarbonate (PC), cellulose tri-acetate (TAC), cellulose acetate propionate, etc.

A barrier layer (not shown) may be further provided between the pixel circuit layer PCL and the substrate 100. The barrier layer may prevent or substantially prevent infiltration of external impurities, and may have a single-layered or multi-layered structure including an inorganic material, such as silicon nitride ($SiN_x$, x>0) or silicon oxide ($SiO_x$, x>0).

The display element layer DEL may include display elements, e.g., an organic light-emitting diode. The pixel circuit layer PCL may include pixel circuits and insulating layers that are respectively connected to the display elements (e.g., organic light-emitting diodes). The pixel circuit layer PCL may include a plurality of transistors and storage capacitors, and insulating layers between the transistors and the storage capacitors.

The display elements may be covered by an encapsulation member, such as a thin film encapsulation layer TFE. The thin film encapsulation layer TFE may include at least one inorganic encapsulation layer and at least one organic encapsulation layer covering the display element layer DEL. In an embodiment, the inorganic encapsulation layer may include one or more inorganic materials selected from aluminum oxide, titanium oxide, tantalum oxide, hafnium oxide, zinc oxide, silicon oxide, silicon nitride, and silicon oxynitride. The organic encapsulation layer may include a polymer-based material. In an embodiment, the polymer-based material may include an acryl-based resin, an epoxy-based resin, polyimide, polyethylene, etc. In an embodiment, the organic encapsulation layer may include acrylate.

An input sensor TSL including touch electrodes may be on the thin film encapsulation layer TFE, and an optical functional layer OFL may be on the input sensor TSL. The input sensor TSL may obtain coordinate information according to an external input, e.g., a touch event. The optical function member OFL may reduce a reflectivity of light (external light) incident to the display device 1, and/or may improve color purity of light emitted from the display device 1. In an embodiment, the optical functional layer OFL may include a retarder and a polarizer. The retarder may be of a film type or a liquid crystal coating type and may include a $\lambda/2$ retarder and/or a $\lambda/4$ retarder. The polarizer may be of a film type or a liquid crystal coating type. The film-type polarizer may include a stretched synthetic resin film, and the liquid crystal coating-type polarizer may include liquid crystals arranged in a certain orientation. The retarder and the polarizer may further include a protective film.

In another embodiment, the optical functional layer OFL may include a black matrix and color filters. The color filters may be arranged taking into account a color of light emitted from each of the pixels in the display device 1. In an embodiment, each of the color filters may include red, green, or blue pigment or dye. In another embodiment, each of the color filters may further include quantum dots in addition to the pigment or dye. In another embodiment, some of the color filters may not include the pigment or dye mentioned above, but may include scattering particles, such as titanium oxide.

In another embodiment, the optical functional layer OFL may include a destructive interference structure. The destructive interference structure may include a first reflective layer and a second reflective layer arranged on different layers. First reflected light and second reflected light that are respectively reflected by the first reflective layer and the second reflective layer may be destructively interfered with each other, and, accordingly, a reflectivity of external light may be reduced.

An adhesive member may be between the input sensor TSL and the optical functional layer OFL. Any of general adhesive members well known in the art may be used without restriction. In an embodiment, the adhesive member may include a pressure sensitive adhesive (PSA).

Figure 3:
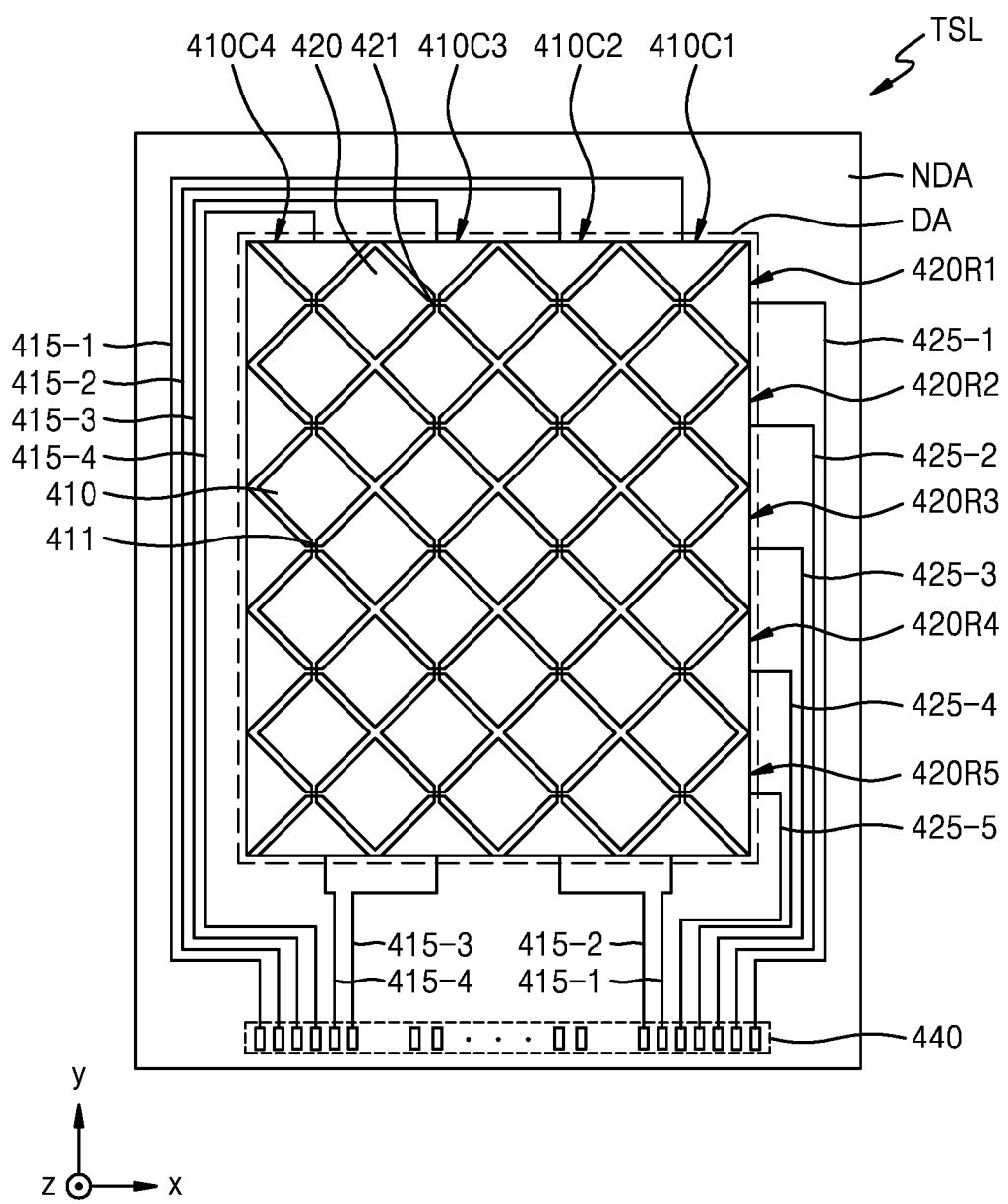
FIG. 3 is a plan view of an input sensor according to an embodiment.

FIG. 3 is a plan view of the input sensor TSL according to an embodiment.

Referring to FIG. 3, the input sensor TSL may include first sensing electrodes 410, first trace lines 415-1 to 415-4 connected to the first sensing electrodes 410, second sensing electrodes 420, and second trace lines 425-1 to 425-5 connected to the second sensing electrodes 420. The first sensing electrodes 410 and the second sensing electrodes 420 may be in the display area DA, and the first trace lines 415-1 to 415-4 and the second trace lines 425-1 to 425-5 may be in the non-display area NDA.

The first sensing electrodes 410 may be arranged in a ty direction, and the second sensing electrodes 420 may be arranged in a ±x direction intersecting with the ty direction. The first sensing electrodes 410 arranged in the ty direction may be connected to one another via first connecting electrodes 411 between adjacent first sensing electrodes 410, and may respectively configure first sensing lines 410C1 to 410C4. The second sensing electrodes 420 arranged in the ±x direction may be connected to one another via second connecting electrodes 421 between adjacent second sensing electrodes 420, and may respectively configure second sensing lines 420R1 to 420R5. The first sensing lines 410C1 to 410C4 and the second sensing lines 420R1 to 420R5 may cross each other. In an embodiment, the first sensing lines 410C1 to 410C4 and the second sensing lines 420R1 to 420R5 may cross each other perpendicularly.

The first sensing lines 410C1 to 410C4 may be connected to a pad of a sensing signal pad portion 440 via the first trace lines 415-1 to 415-4 in the non-display area NDA. For example, the first trace lines 415-1 to 415-4 may each have a double routing structure, that is, may be respectively connected to upper and lower sides of the first sensing lines 410C1 to 410C4. The first trace lines 415-1 to 415-4 respectively connected to the upper and lower sides of the first sensing lines 410C1 to 410C4 may be connected to corresponding pads, respectively. The above structure may improve a sensitivity. In another embodiment, the first trace lines 415-1 to 415-4 may each have a single routing structure, that is, may be connected to upper or lower side of the first sensing lines 410C1 to 410C4, respectively.

The second sensing lines 420R1 to 420R5 may be connected to pads of the sensing signal pad portion 440 via the second trace lines 425-1 to 425-5 in the non-display area NDA. For example, the second trace lines 425-1 to 425-5 may be respectively connected to corresponding pads.

Figure 4:
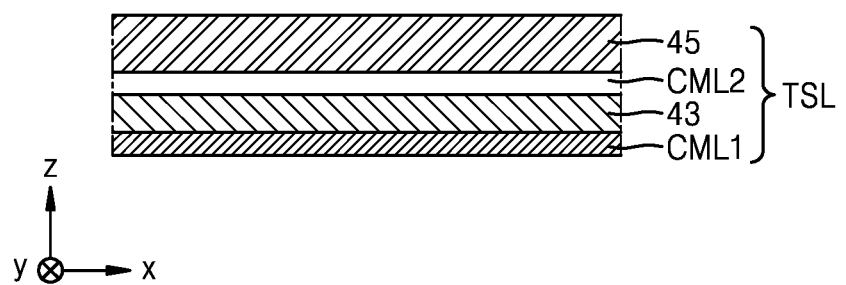
FIG. 4 is a cross-sectional view of a stack structure in an input sensor according to an embodiment.

FIG. 4 is a cross-sectional view of a stack structure in the input sensor TSL according to an embodiment.

Referring to FIG. 4, the input sensor TSL may include a first conductive layer CML1 and a second conductive layer CML2. A first touch insulating layer 43 is between the first conductive layer CML1 and the second conductive layer CML2, and a second touch insulating layer 45 may be on the second conductive layer CML2. Each of the first sensing electrodes 410, the first connecting electrodes 411, the second sensing electrodes 420, and the second connecting electrodes 421 described above with reference to FIG. 3 may be included in one of the first conductive layer CML1 and the second conductive layer CML2.

The first conductive layer CML1 or the second conductive layer CML2 may include a metal layer or a transparent conductive layer. In an embodiment, the metal layer may include any of molybdenum (Mo), mendelevium (Md), silver (Ag), titanium (Ti), copper (Cu), aluminum (Al), and an alloy thereof. The transparent conductive layer may include a transparent conductive oxide material, such as indium tin oxide (ITO), indium zinc oxide (IZO), zinc oxide (ZnO), indium tin zinc oxide (ITZO), etc. In addition, the transparent conductive layer may include a conductive polymer such as PEDOT, metal nano-wires, graphene, etc.

The first conductive layer CML1 or the second conductive layer CML2 may have a single-layered or multi-layered structure. The first conductive layer CML1 or the second conductive layer CML2 of the single-layered structure may include a metal layer or a transparent conductive layer, and the metal layer and the transparent conductive layer may include any of the above materials. One of the first conductive layer CML1 and the second conductive layer CML2 may include a single metal layer. One of the first conductive layer CML1 and the second conductive layer CML2 may include a multi-layered metal layer. The multi-layered metal layer may include, for example, a triple layer structure including titanium layer/aluminum layer/titanium layer, or a double layer structure including molybdenum layer/mendelevium layer. In another embodiment, the multi-layered metal layer may include a metal layer and a transparent conductive layer. The first conductive layer CML1 and the second conductive layer CML2 may have stack structures that are the same as or different from each other. For example, the first conductive layer CML1 may include a metal layer, and the second conductive layer CML2 may include a transparent conductive layer. In another embodiment, the first conductive layer CML1 and the second conductive layer CML2 may include a same metal layer.

The materials included in the first conductive layer CML1 and the second conductive layer CML2 and arrangement of sensing electrodes included in the first conductive layer CML1 and the second conductive layer CML2 may be determined according to a sensitivity. An RC delay may affect the sensitivity, and sensing electrodes including the metal layer have less resistance as compared with the transparent conductive layer, and thus an RC value is reduced. Therefore, a time taken to charge a capacitor defined between the sensing electrodes may be reduced. The sensing electrodes including the transparent conductive layers are not visible by a user as compared with the metal layer, and an input area is increased to increase a capacitance.

Each of the first touch insulating layer 43 and the second touch insulating layer 45 may include an inorganic insulating material and/or an organic insulating material. In an embodiment, the inorganic insulating material may include silicon oxide, silicon nitride, or silicon oxynitride, and the organic insulating material may include a polymer organic material.

In FIG. 4, the input sensor TSL includes the first conductive layer CML1, the first touch insulating layer 43, the second conductive layer CML2, and the second touch insulating layer 45, but, in another embodiment, a buffer layer including an inorganic insulating material or an organic insulating material may be further arranged under the first conductive layer CML1.

Figure 5A:
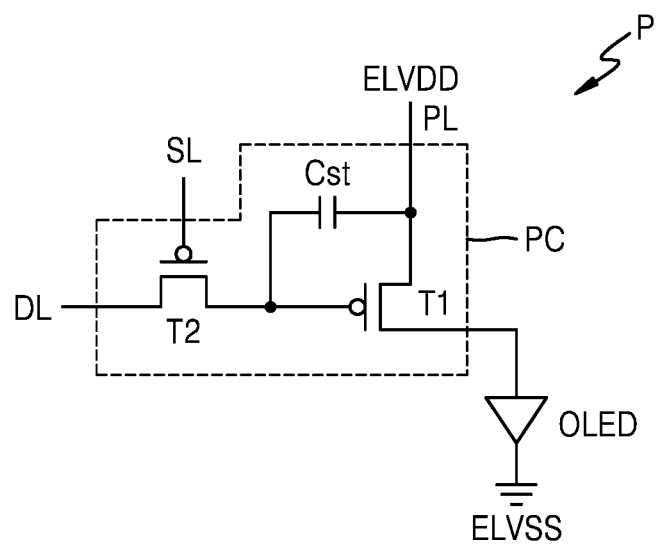
FIGS. 5A and 5B are equivalent circuit diagrams of a pixel included in a display device according to some embodiments.
Figure 5B:
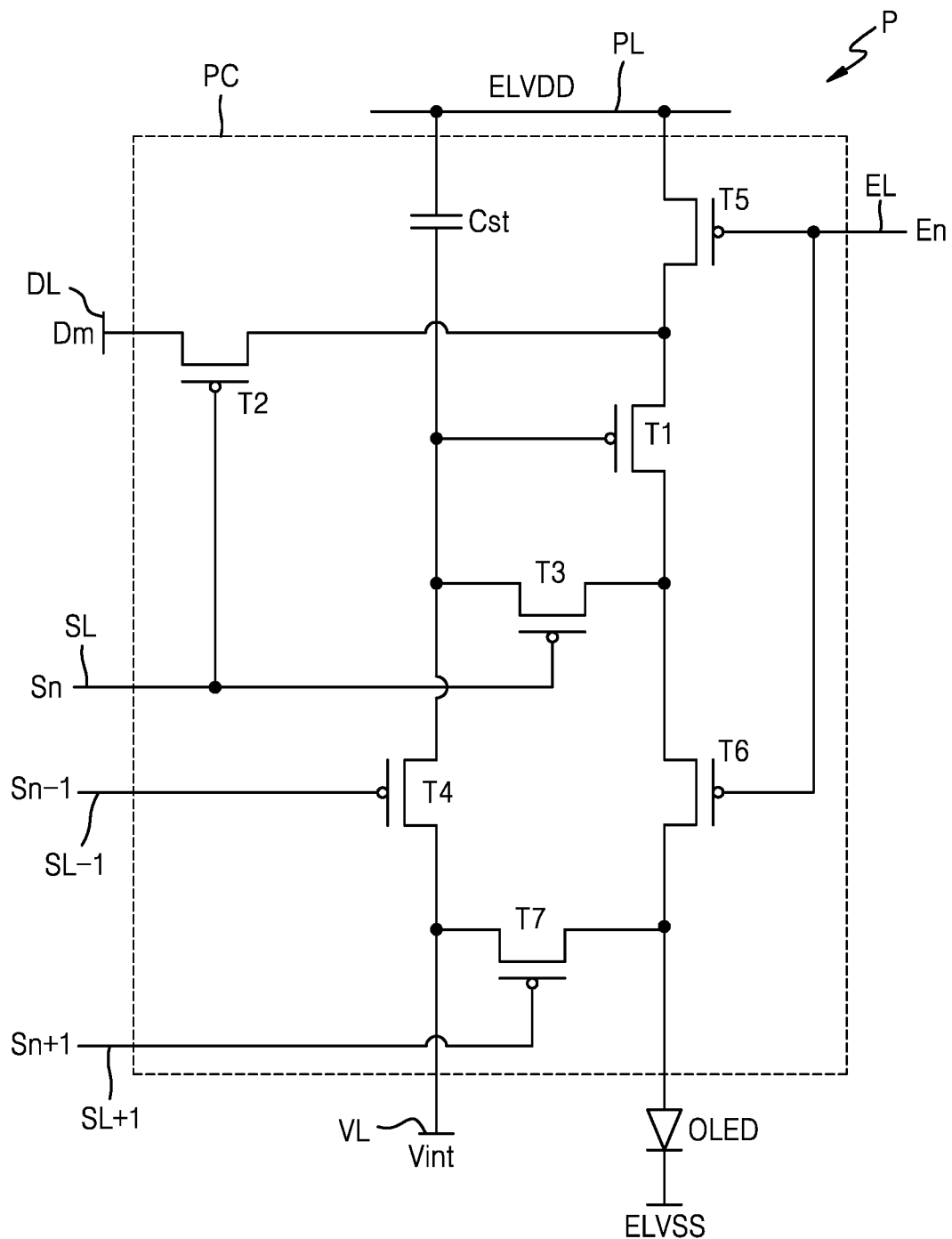

FIGS. 5A and 5B are equivalent circuit diagrams of a pixel P included in a display device according to some embodiments.

Referring to FIG. 5A, in an embodiment, the pixel P may include a pixel circuit PC and an organic light-emitting diode OLED, that is, a display element connected to the pixel circuit PC.

In an embodiment, the pixel circuit PC may include a driving thin film transistor T1, a switching thin film transistor T2, and a storage capacitor Cst. Each pixel P may emit, for example, red light, green light, or blue light via the organic light-emitting diode OLED, or may emit red light, green light, blue light, or white light via the organic light-emitting diode OLED.

The switching thin film transistor T2 is connected to a scan line SL and a data line DL, and may be configured to transfer a data voltage input from the data line DL to the driving thin film transistor T1 based on a switching voltage input from the scan line SL. The storage capacitor Cst is connected to the switching thin film transistor T2 and a driving voltage line PL and may store a voltage corresponding to a difference between a voltage transferred from the switching thin film transistor T2 and a first power voltage ELVDD supplied to the driving voltage line PL.

The driving TFT T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a certain luminance according to the driving current. An opposite electrode (e.g., a cathode) of the organic light-emitting diode OLED may receive supply of a second power voltage ELVSS.

In an embodiment, referring to FIG. 5B, the pixel circuit PC may include the driving thin film transistor T1, the switching thin film transistor T2, a compensating thin film transistor T3, a first initialization thin film transistor T4, an operation control thin film transistor T5, an emission control thin film transistor T6, and a second initialization thin film transistor T7.

In FIG. 5B, each of the pixel circuits PC includes signal lines SL, SL−1, SL+1, EL, and DL, an initialization voltage line VL, and a driving voltage line PL, but, in another embodiment, at least one of the signal lines SL, SL−1, SL+1, EL, and DL, and/or the initialization voltage line VL may be shared by adjacent pixel circuits.

A drain electrode of the driving thin film transistor T1 may be electrically connected to the organic light-emitting diode OLED via the emission control thin film transistor T6. The driving thin film transistor T1 receives a data signal Dm according to a switching operation of the switching thin film transistor T2 to supply a driving current to the organic light-emitting diode OLED.

A gate electrode of the switching thin film transistor T2 is connected to the scan line SL, and a source electrode of the switching thin film transistor T2 is connected to the data line DL. A drain electrode of the switching thin film transistor T2 is connected to a source electrode of the driving thin film transistor T1, and, at the same time, may be connected to the driving voltage line PL via the operation control thin film transistor T5.

The switching thin film transistor T2 is turned on according to a scan signal Sn received through the scan line SL and performs a switching operation for transferring the data signal Dm transferred through the data line DL to the source electrode of the driving thin film transistor T1.

A gate electrode of the compensating thin film transistor T3 may be connected to the scan line SL. A source electrode of the compensating thin film transistor T3 is connected to the drain electrode of the driving thin film transistor T1, and, at the same time, may be connected to a pixel electrode of the organic light-emitting diode OLED via the emission control thin film transistor T6. A drain electrode of the compensating thin film transistor T3 may be connected to one electrode of the storage capacitor Cst, together with the source electrode of the first initialization thin film transistor T4 and the gate electrode of the driving thin film transistor T1. The compensating thin film transistor T3 is turned on according to the scan signal Sn transferred through the scan line SL, and connects the gate electrode and the drain electrode of the driving thin film transistor T1 to each other for diode-connecting the driving thin film transistor T1.

A gate electrode of the first initialization thin film transistor T4 may be connected to the previous scan line SL−1. The drain electrode of the first initialization thin film transistor T4 may be connected to the initialization voltage line VL. A source electrode of the first initialization thin film transistor T4 may be connected to one electrode of the storage capacitor Cst, together with the drain electrode of the compensating thin film transistor T3 and the gate electrode of the driving thin film transistor T1. The first initialization thin film transistor T4 is turned on according to a scan signal Sn-1 transferred through the previous scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 may be connected to an emission control line EL. A source electrode of the operation control thin film transistor T5 may be connected to the driving voltage line PL. A drain electrode of the operation control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensating thin film transistor T3. A drain electrode of the emission control thin film transistor T6 may be electrically connected to the pixel electrode of the organic light-emitting diode OLED. The operation control thin film transistor T5 and the emission control thin film transistor T6 are concurrently (e.g., simultaneously) turned on according to an emission control signal En transferred through the emission control line EL to transfer the first power voltage ELVDD to the organic light-emitting diode OLED, and a driving current flows through the organic light-emitting diode OLED.

The gate electrode of the second initialization thin film transistor T7 may be connected to a post scan line SL+1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin-film transistor T7 is turned on according to a post scan signal Sn+1 transferred through the post scan line SL+1 to initialize the pixel electrode of the organic light-emitting diode OLED.

In FIG. 5B, the first initialization thin film transistor T4 and the second initialization thin film transistor T7 are respectively connected to the previous scan line SL−1 and the post scan line SL+1, but, in another embodiment, the first initialization thin film transistor T4 and the second initialization thin film transistor T7 may be both connected to the previous scan line SL−1 and may be driven according to the previous scan signal Sn−1.

Another electrode of the storage capacitor Cst may be connected to the driving voltage line PL. One electrode of the storage capacitor Cst may be connected to the gate electrode of the driving thin film transistor T1, the drain electrode of the compensating thin film transistor T3, and the source electrode of the first initialization thin film transistor T4.

An opposite electrode (e.g., a cathode) of the organic light-emitting diode OLED may receive supply of the second power voltage ELVSS. The organic light-emitting diode OLED emits light after receiving a driving current from the driving thin film transistor T1.

However, the pixel circuit PC is not limited to the number and circuit design of the thin film transistors and the storage capacitor illustrated with reference to FIGS. 5A and 5B, and the number and the circuit design may vary.

Figure 6:
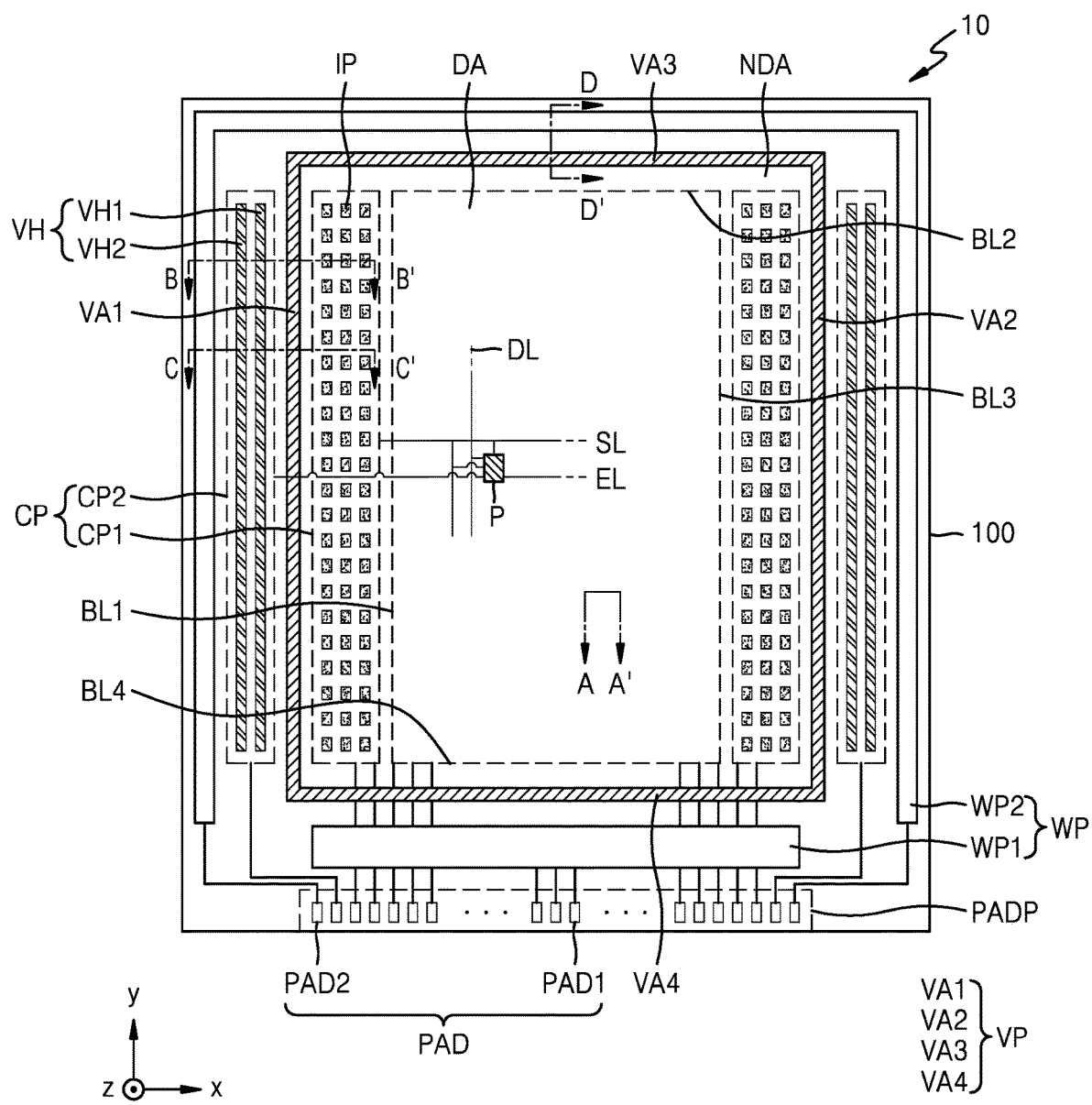
FIG. 6 is a plan view of a display panel according to an embodiment.

FIG. 6 is a plan view of the display panel 10 according to an embodiment.

Referring to FIG. 6, the display panel 10 may include the substrate 100 including the display area DA and the non-display area NDA. The pixels P may be in the display area DA, and the non-display area NDA may include a circuit portion CP, a valley portion VP, a voltage wiring portion WP, and a pad portion PADP.

In an embodiment, the display area DA may have a polygonal shape. In another embodiment, the display area DA may have a polygonal shape including a curvature. In another embodiment, the display area DA may have a circular shape. Herein, a case in which the display area DA has a polygonal shape will be described in further detail. In particular, a case in which the display area DA has a rectangular shape will be described in further detail.

In an embodiment, the non-display area NDA may surround the display area DA. Here, a virtual boundary line between the display area DA and the non-display area NDA may be defined. For example, the virtual boundary line may include a first boundary line BL1, a second boundary line BL2, a third boundary line BL3, and a fourth boundary line BL4. The first boundary line BL1 and the third boundary line BL3 may extend in a first direction (e.g., a y-direction). In addition, the first boundary line BL1 and the third boundary line BL3 may be apart from each other. The second boundary line BL2 and the fourth boundary line BL4 may extend in a second direction (e.g., an x-direction). In addition, the second boundary line BL2 and the fourth boundary line BL4 may be apart from each other.

The pixel P may be connected to the data line DL extending in the first direction (e.g., the y-direction) and the scan line SL and the emission control line EL extending in the second direction (e.g., the x-direction). In addition, although not shown in the drawing, the pixel P may be also connected to the driving voltage line PL (see FIG. 5A).

The circuit portion CP may be connected to the scan line SL or the emission control line EL to apply a signal to the pixel P. The circuit portion CP may be in the non-display area NDA. The circuit portion CP may correspond to a part of the virtual boundary line between the display area DA and the non-display area NDA. In an embodiment, the circuit portion CP may correspond to a part of the first boundary line BL1 and/or the third boundary line BL3. Therefore, the circuit portion CP may extend in the first direction (e.g., y-direction). In this case, the circuit portion CP may correspond to the first boundary line BL1 and/or the third boundary line BL3, and may not correspond to the second boundary line BL2. In an embodiment, the circuit portion CP may include a first circuit portion CP1 and a second circuit portion CP2.

The first circuit portion CP1 may be between the valley portion VP and the display area DA. That is, the first circuit portion CP1 may be closer to the display area DA than the second circuit portion CP2. The first circuit portion CP1 may include at least one first thin film transistor. In an embodiment, the first circuit portion CP1 may be configured to transfer a scan signal to the pixel P in the display area DA. Here, the first circuit portion CP1 may be connected to the scan line SL. In another embodiment, the first circuit portion CP1 may be configured to transfer an emission control signal to the pixel P in the display area DA. Here, the first circuit portion CP1 may be connected to the emission control line EL.

In an embodiment, an internal layer may be on the first circuit portion CP1. The internal layer may be an insulating layer including an organic material or an inorganic material. Here, the internal layer may include a plurality of island portions IP on the first circuit portion CP1, and the plurality of island portions IP may be apart from one another. In an embodiment, the plurality of island portions IP may be apart from one another in the first direction (e.g., the y-direction) and/or the second direction (e.g., the x-direction) intersecting the first direction.

The second circuit portion CP may be at an outside of the valley portion VP. That is, the second circuit portion CP2 may be farther from the display area DA than the first circuit portion CP1. The second circuit portion CP2 may include at least one second thin film transistor. In an embodiment, the second circuit portion CP2 may be configured to transfer an emission control signal to the pixel P in the display area DA. Here, the second circuit portion CP2 may be connected to the emission control line EL. Herein, a case in which the first circuit portion CP1 is connected to the scan line SL and the second circuit portion CP2 is connected to the emission control line EL will be described in further detail.

In an embodiment, an external layer may be on the second circuit portion CP2. The external layer may be an insulating layer including an organic material or an inorganic material. The external layer may include at least one groove VH extending in the first direction (e.g., the y-direction). That is, the external layer may include at least one groove VH that extends corresponding to the first boundary line BL1 or the third boundary line BL3. Therefore, the at least one groove VH may extend along a side of the display area DA.

In an embodiment, the at least one groove VH may include a plurality of grooves VH. For example, the plurality of grooves VH may include a first groove VH1 and a second groove VH2. Here, the first groove VH1 may be closer to the display area DA than the second groove VH2. In another embodiment, the plurality of grooves VH may include three or more grooves VH.

The valley portion VP may divide the first circuit portion CP1 and the second circuit portion CP2 from each other, and may surround the display area DA in the non-display area NDA. In further detail, the valley portion VP may include a first valley area VA1 and a second valley area VA2 facing each other with the display area DA therebetween. Here, the first valley area VA1 and the second valley area VA2 may extend in the first direction (e.g., the y-direction). Also, the valley portion VP may include a third valley area VA3 and a fourth valley area VA4 facing each other with the display area DA therebetween. Here, the third valley area VA3 and the fourth valley area VA4 may extend in the second direction (e.g., the x-direction). The first valley area VA1 and the second valley area VA2 may be connected to the third valley area VA3. In addition, the first valley area VA1 and the second valley area VA2 may be connected to the fourth valley area VA4.

The valley portion VP may divide the insulating layer on the display panel 10. Therefore, moisture or impurities generated from an outer side of the valley portion VP in the non-display area NDA may be prevented or substantially prevented from infiltrating into the display area DA.

In an embodiment, the valley portion VP may divide the circuit portion CP into the first circuit portion CP1 and the second circuit portion CP2. That the valley portion VP divides the circuit portion CP into the first circuit portion CP1 and the second circuit portion CP2 denotes that the first circuit portion CP1 and the second circuit portion CP2 are separated from each other. Therefore, the plurality of island portions IP that are apart from one another in the first direction (e.g., the y-direction) and/or the second direction (e.g., the x-direction) may be between the valley portion VP and the display area DA, and the at least one groove VH may extend in the first direction (e.g., the y-direction) at the outside of the valley portion VP.

The voltage wiring portion WP may be configured to transfer the power voltage to the pixel P in the display area DA. In an embodiment, the voltage wiring portion WP may surround the display area DA. The voltage wiring portion WP may be connected to a pad PAD of the pad portion PADP. The voltage wiring portion WP may include a first voltage wiring portion WP1 and a second voltage wiring portion WP2. Here, the first voltage wiring portion WP1 may be configured to transfer the first power voltage ELVDD (see FIG. 5A) to the pixels P in the display area DA, and the second voltage wiring portion WP2 may be configured to transfer the second power voltage ELVSS (see FIG. 5A) to the pixels P in the display area DA.

The first voltage wiring portion WP1 may extend in the second direction (e.g., the x-direction). In this case, the first voltage wiring portion WP1 may extend corresponding to the fourth boundary line BL4. In an embodiment, the first voltage wiring portion WP1 may be between the display area DA and the pad portion PADP.

The second voltage wiring portion WP2 may at least partially surround the display area DA. In an embodiment, the second voltage wiring portion WP2 may extend along the virtual boundary lines except for the virtual boundary line that is adjacent to the first voltage wiring portion WP1. For example, the second voltage wiring portion WP2 may extend corresponding to the first boundary line BL1, the second boundary line BL2, and the third boundary line BL3. In addition, the second circuit portion CP2 may be between the second voltage wiring portion WP2 and the valley portion VP.

In an embodiment, the pad portion PADP is at an end portion of the substrate 100 and may include a plurality of pads PAD. In an embodiment, the pad portion PADP may correspond to the fourth boundary line BL4. The pad portion PADP is not covered by an insulating layer but is exposed, and may be electrically connected to a controller (not shown) such as a flexible printed circuit board, an operation driver integrated circuit (IC) chip, etc.

The controller changes a plurality of signals transferred from outside into a plurality of image data signals, and may transfer the changed signals to the display area DA via some of the plurality of pads PAD. Also, the controller may provide the first power voltage ELVDD (see FIG. 5A) to the first voltage wiring portion WP1 via a first pad PAD1 from among the plurality of pads PAD and may provide the second power voltage ELVSS (see FIG. 5A) to the second voltage wiring portion WP2 via a second pad PAD2 from among the plurality of pads PAD.

In addition, although not shown in the drawings, a data circuit portion may be further provided in the non-display area NDA, wherein the data circuit portion provides the data signal from the data line DL to each of the pixels P.

In an embodiment, the at least one groove VH at the outside of the valley portion VP in the non-display area NDA may be provided to prevent or substantially prevent overflow of an organic encapsulation layer in the thin film encapsulation layer that extends from the display area DA to the valley portion VP while sealing the display area DA, or to check the overflowed organic encapsulation layer. This will be described further later with reference to FIGS. 8 and 9, and a stack structure on the display area DA in the display panel 10 will be described first with reference to FIG. 7 below.

Figure 7:
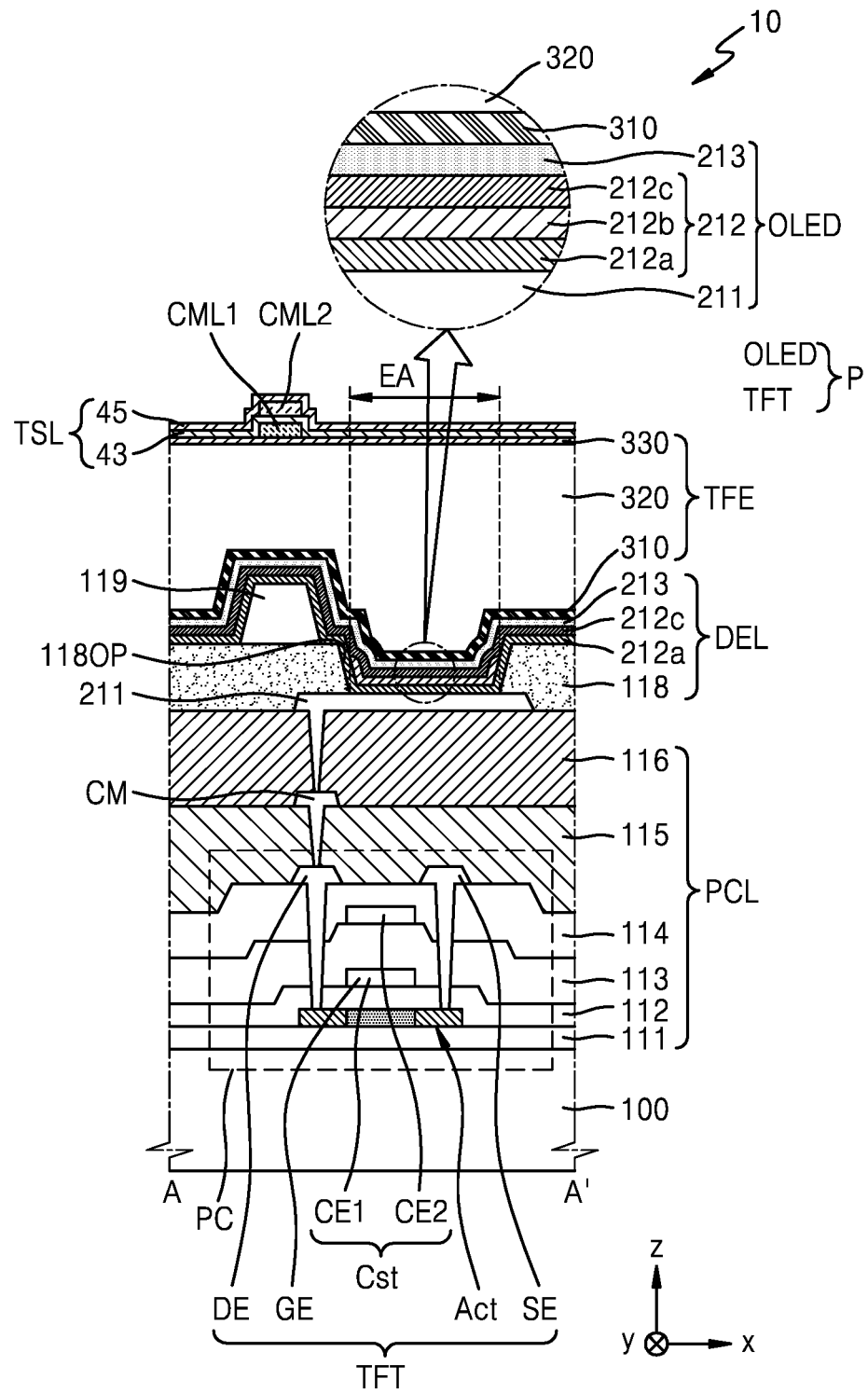
FIG. 7 is a cross-sectional view of the display panel taken along the line A-A' of FIG. 6.

FIG. 7 is a cross-sectional view of the display panel 10 taken along the line A-A' of FIG. 6.

Referring to FIG. 7, the display panel 10 may include the substrate 100, a pixel circuit layer PCL, a display element layer DEL, and a thin film encapsulation layer TFE.

The pixel circuit layer PCL may be on the substrate 100. The pixel circuit layer PCL may include a thin film transistor TFT, and a buffer layer 111, a first gate insulating layer 112, a second gate insulating layer 113, an interlayer insulating layer 114, a first planarized insulating layer 115, and a second planarized insulating layer 116 that are under and/or on the elements of the thin film transistor TFT.

In an embodiment, the buffer layer 111 may include an inorganic insulating material, such as any of silicon nitride, silicon oxynitride, and silicon oxide, and may have a single-layered or multi-layered structure including the inorganic insulating material.

The thin film transistor TFT may include a semiconductor layer Act, and, in an embodiment, the semiconductor layer Act may include polysilicon. In another embodiment, the semiconductor layer Act may include amorphous silicon, an oxide semiconductor, an organic semiconductor, etc. The semiconductor layer Act may include a channel region, and a drain region and a source region at opposite sides of the channel region. A gate electrode GE may overlap the channel region.

The gate electrode GE may include a low-resistive metal material. In an embodiment, the gate electrode GE may include a conductive material including molybdenum (Mo), aluminum (Al), copper (Cu), titanium (Ti), etc., and may have a single-layered or multi-layered structure.

The first gate insulating layer 112 between the semiconductor layer Act and the gate insulating layer GE may include an inorganic insulating material, such as any of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second gate insulating layer 113 may cover the gate electrode GE. Similarly to the first gate insulating layer 112, the second gate insulating layer 113 may include an inorganic insulating material, such as any of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

An upper electrode CE2 of the storage capacitor Cst may be on the second gate insulating layer 113. The upper electrode CE2 may overlap the gate electrode GE thereunder. Here, the gate electrode GE and the upper electrode CE2 overlapping each other with the second gate insulating layer 113 therebetween may configure the storage capacitor Cst. That is, the gate electrode GE may function as a lower electrode CE1 of the storage capacitor Cst.

As described above, the storage capacitor Cst and the thin film transistor TFT may overlap each other. However, in some embodiments, the storage capacitor Cst may not overlap the thin film transistor TFT.

In an embodiment, the upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) in a single-layered or multi-layered structure.

The interlayer insulating layer 114 may cover the upper electrode CE2. The interlayer insulating layer 114 may include an insulating material, such as any of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 114 may have a single-layered or a multi-layered structure including the inorganic insulating material.

A drain electrode DE and a source electrode SE may be on the interlayer insulating layer 114. The drain electrode DE and the source electrode SE may include a highly conductive material. The drain electrode DE and the source electrode SE may include a conductive material including molybdenum (Mo), aluminum (Al), copper (Cu), titanium (Ti), etc., and may have a single-layered or multi-layered structure including the above materials. In an embodiment, the drain electrode DE and the source electrode SE may have a multi-layered structure including Ti/Al/Ti.

The first planarized insulating layer 115 may cover the drain electrode DE and the source electrode SE. The first planarized insulating layer 115 may include an organic insulating layer. In an embodiment, the first planarized insulating layer 115 may include a general-purpose polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof.

A connecting electrode CM may be on the first planarized insulating layer 115. Here, the connecting electrode CM may be connected to the drain electrode DE or the source electrode SE via a contact hole in the first planarized insulating layer 115. The connecting electrode CM may include a highly conductive material. The connecting electrode CM may include a conductive material including molybdenum (Mo), aluminum (Al), copper (Cu), titanium (Ti), etc., and may have a single-layered or multi-layered structure. In an embodiment, the connecting electrode CM may have a multi-layered structure including Ti/Al/Ti.

The second planarized insulating layer 116 may cover the connecting electrode CM. The first planarized insulating layer 115 may include an organic insulating layer. In an embodiment, the second planarized insulating layer 116 may include a general-purpose polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof.

The display element layer DEL may be on the pixel circuit layer PCL. The display element layer DEL includes an organic light-emitting diode OLED, and a pixel electrode 211 of the organic light-emitting diode OLED may be electrically connected to the connecting electrode CM via a contact hole in the second planarized insulating layer 116.

The pixel P may include the organic light-emitting diode OLED and the thin film transistor TFT. Each pixel P may emit, for example, red light, green light, or blue light via the organic light-emitting diode OLED, or may emit red light, green light, blue light, or white light via the organic light-emitting diode OLED.

In an embodiment, the pixel electrode 211 may include a conductive oxide, such as indium tin oxide (ITO), indium zinc oxide (IZO), zinc oxide (ZnO), indium oxide ($In_2O_3$), indium gallium oxide, or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 211 may further include a layer including ITO, IZO, ZnO, or $In_2O_3$ on and/or under the reflective layer.

A pixel defining layer 118 having an opening 118OP exposing a center of the pixel electrode 211 is on the pixel electrode 211. The pixel defining layer 118 may include an organic insulating material and/or an inorganic insulating material. The opening 118OP may define an emission area of the light (herein, referred to as an emission area EA) emitted from the organic light-emitting diode OLED. For example, a width of the opening 118OP may correspond to a width of the emission area EA.

In an embodiment, a spacer 119 may be on the pixel defining layer 118. The spacer 119 may prevent or substantially prevent damage to the substrate 100 in a method of manufacturing a display device. In a method of manufacturing the display device, a mask sheet may be used, and a defect, for example, the substrate 100 being partially damaged or broken, generated when the mask sheet may enter the opening 118OP of the pixel defining layer 118 or in close contact with the pixel defining layer 118 when a deposition material is deposited on the substrate 100, may be prevented.

In an embodiment, the spacer 119 may include an organic insulating material, such as polyimide. In another embodiment, the spacer 119 may include an inorganic insulating material, such as silicon nitride or silicon oxide. In another embodiment, the spacer 119 may include an organic insulating material and an inorganic insulating material.

In an embodiment, the spacer 119 may include a material different from that of the pixel defining layer 118. In another embodiment, the spacer 119 may include the same material as that of the pixel defining layer 118, and, in this case, the pixel defining layer 118 and the spacer 119 may be manufactured together during a mask process using a half-tone mask, etc. Herein, an example in which the pixel defining layer 118 and the spacer 119 include an organic insulating material will be described in further detail below.

An intermediate layer 212 may be on the pixel defining layer 118. The intermediate layer 212 may include an emission layer 212b in the opening 118OP of the pixel defining layer 118. The emission layer 212b may include a polymer or low-molecular weight organic material emitting light (e.g., predetermined color light).

In an embodiment, a first functional layer 212a and a second functional layer 212c may be under and on the emission layer 212b. The first functional layer 212a may include, for example, a hole transport layer (HTL), or an HTL and a hole injection layer (HIL). The second functional layer 212c is on the emission layer 212b, and is an optional element. The second functional layer 212c may include an electron transport layer (ETL) and/or an electron injection layer (EIL). In an embodiment, the first functional layer 212a and/or the second functional layer 212c may be common layers configured to entirely cover the substrate 100, like an opposite electrode 213 that is described below.

In an embodiment, the opposite electrode 213 may include a conductive material having a low work function. For example, the opposite electrode 213 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another embodiment, the opposite electrode 213 may further include a layer including ITO, IZO, ZnO, or $In_2O_3$ on the (semi-) transparent layer including the above material.

In some embodiments, a capping layer (not shown) may be further provided on the opposite electrode 213. The capping layer may include LiF, an inorganic material, and/or an organic material.

The thin film encapsulation layer TFE may be on the opposite electrode 213. In an embodiment, the thin film encapsulation layer TFE may include at least one inorganic encapsulation layer and at least one organic encapsulation layer, and FIG. 7 shows that, in an embodiment, the thin film encapsulation layer TFE includes a first inorganic encapsulation layer 310, an organic encapsulation layer 320, and a second inorganic encapsulation layer 330 that are sequentially stacked.

In an embodiment, the first inorganic encapsulation layer 310 and the second inorganic encapsulation layer 330 may each include one or more inorganic materials from aluminum oxide, titanium oxide, tantalum oxide, hafnium oxide, zinc oxide, silicon nitride, and silicon oxynitride. In an embodiment, the organic encapsulation layer 320 may include a polymer-based material. The polymer-based material may include an acryl-based resin, an epoxy-based resin, polyimide, polyethylene, etc. In an embodiment, the organic encapsulation layer 320 may include acrylate.

The input sensor TSL may be on the thin film encapsulation layer TFE. In the input sensor TSL, an insulating layer and a conductive layer may be alternately laminated. For example, the input sensor TSL may include a first conductive layer CML1 and a second conductive layer CML2. Here, a first touch insulating layer 43 is between the first conductive layer CML1 and the second conductive layer CML2, and a second touch insulating layer 45 may be on the second conductive layer CML2. Each of the first sensing electrodes 410, the first connecting electrodes 411, the second sensing electrodes 420, and the second connecting electrodes 421 described above with reference to FIG. 3 may be included in one of the first conductive layer CML1 and the second conductive layer CML2.

Figure 8:
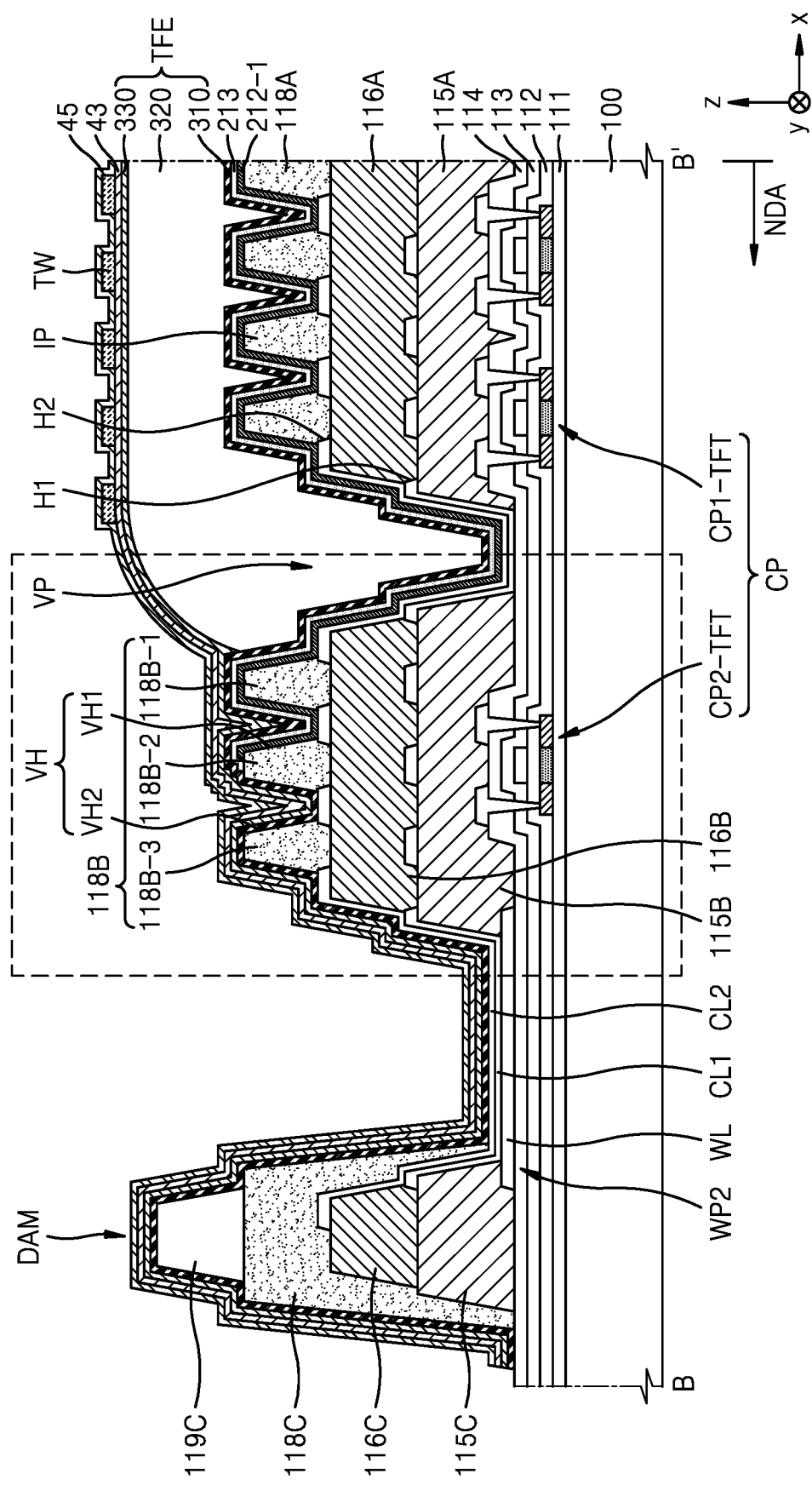
FIG. 8 is a cross-sectional view of the display panel taken along the line B-B' of FIG. 6.
Figure 9:
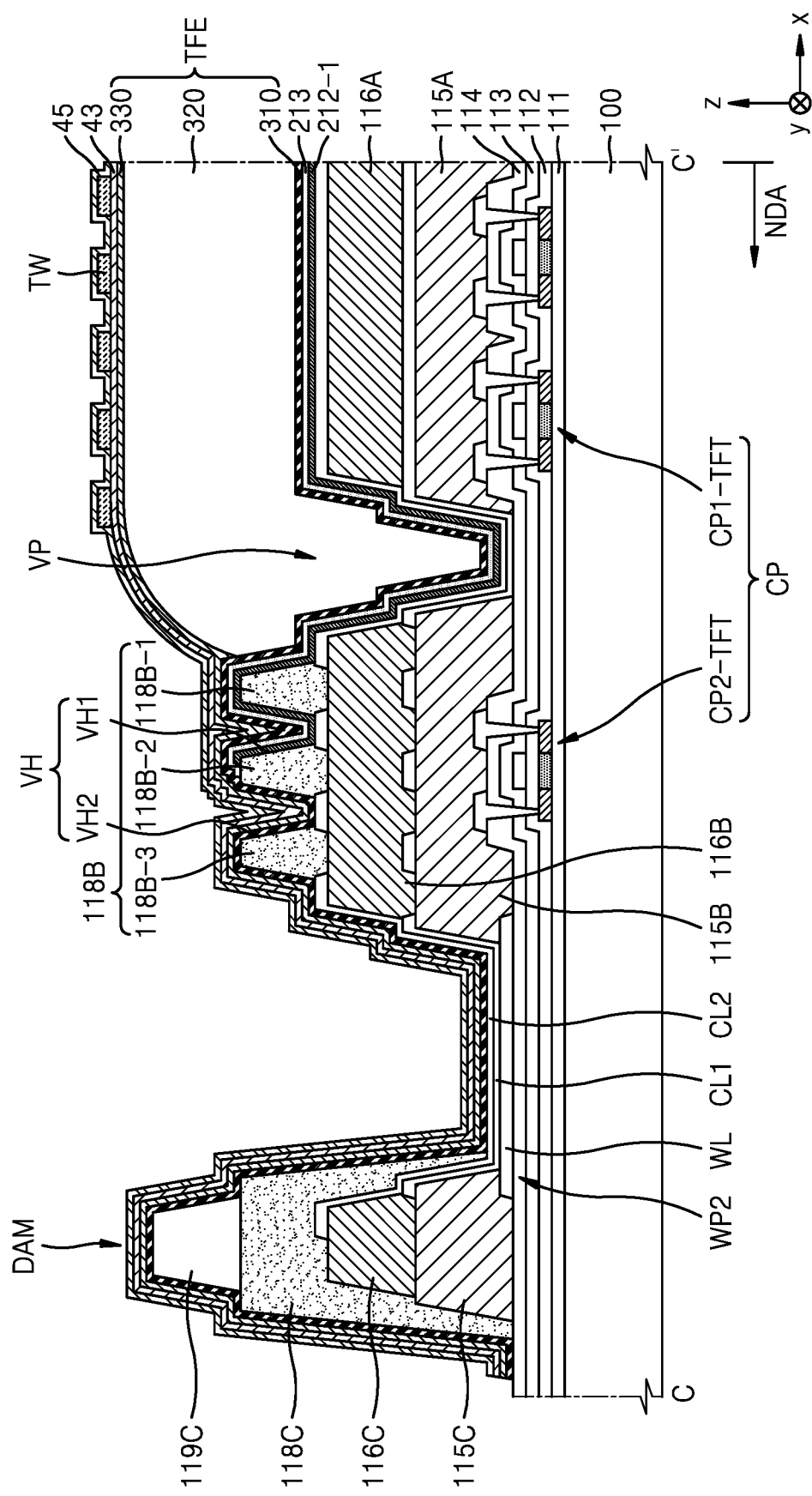
FIG. 9 is a cross-sectional view of the display panel taken along the line C-C' of FIG. 6.

FIG. 8 is a cross-sectional view of the display panel 10 taken along the line B-B' of FIG. 6; and FIG. 9 is a cross-sectional view of the display panel 10 taken along the line C-C' of FIG. 6.

Referring to FIGS. 8 and 9, the circuit portion CP, the valley portion VP, the second voltage wiring portion WP2, and a dam portion DAM may be in the non-display area NDA.

The circuit portion CP may be divided into a first circuit portion and a second circuit portion by the valley portion VP. The first circuit portion may include at least one first thin film transistor CP1-TFT, and the second circuit portion may include at least one second thin film transistor CP2-TFT.

A first internal insulating layer 115A, a second internal insulating layer 116A, and an internal layer 118A may be on the first thin film transistor CP1-TFT. The first internal insulating layer 115A may include a same material as that of the first planarized insulating layer 115 (see FIG. 7), and may be formed concurrently (e.g., simultaneously) with the first planarized insulating layer 115 (see FIG. 7). The second internal insulating layer 116A may include a same material as that of the second planarized insulating layer 116 (see FIG. 7), and may be formed concurrently (e.g., simultaneously) with the second planarized insulating layer 116 (see FIG. 7).

In an embodiment, a first connecting conductive layer CL1 including a plurality of first holes H1 may be between the first internal insulating layer 115A and the second internal insulating layer 116A. In an embodiment, the first connecting conductive layer CL1 may extend from the first thin film transistor CP1-TFT to the second thin film transistor CP2-TFT. The first connecting conductive layer CL1 may include a same material as that of the connecting electrode CM (see FIG. 7) and may be formed concurrently (e.g., simultaneously) with the connecting electrode CM (see FIG. 7). The plurality of first holes H1 may act as paths for discharging a gas generated from the first internal insulating layer 115A. Therefore, an issue of degrading quality of images displayed on the display area due to the infiltration of the gas generated from the first internal insulating layer 115A into the display area may be prevented or reduced. In some embodiments, the first connecting conductive layer CL1 may be omitted.

In an embodiment, a second connecting conductive layer CL2 may be on the second internal insulating layer 116A. The second connecting conductive layer CL2 may include a plurality of second holes H2. In an embodiment, the plurality of second holes H2 may be apart from the plurality of first holes H1. In an embodiment, the second connecting conductive layer CL2 may extend from the first thin film transistor CP1-TFT to the second thin film transistor CP2-TFT.

The second connecting conductive layer CL2 may include a same material as that of the pixel electrode 211 (see FIG. 7) and may be concurrently (e.g., simultaneously) formed with the pixel electrode 211 (see FIG. 7). The plurality of second holes H2 may act as paths for discharging a gas generated from the first internal insulating layer 115A and/or the second internal insulating layer 116A when manufacturing the display device. Therefore, an issue of degrading quality of images displayed on the display area due to infiltration of the gas generated from the first internal insulating layer 115A and/or the second internal insulating layer 116A into the display area may be prevented or reduced.

In an embodiment, the internal layer 118A may include the plurality of island portions IP on the second internal insulating layer 116A. Here, the plurality of island portions IP may be apart from one another and may respectively correspond to the plurality of second holes H2. Therefore, the plurality of island portions IP may fill in the plurality of second holes H2. The plurality of island portions IP may prevent or substantially prevent deterioration of a side surface of the second connecting conductive layer CL2, which is exposed by the plurality of second holes H2. For example, when the second connecting conductive layer CL2 has a multi-layered structure including ITO/Ag/ITO, the Ag layer may be exposed by the second holes H2. In this case, the ITO layer and the Ag layer may be etched due to post-processes for manufacturing the display device, and an etching degree of the Ag layer may be greater than an etching degree of the ITO layer, and the Ag layer may be further etched. In an embodiment, the plurality of island portions IP fill the plurality of second holes H2, and, thus, the above issue may be prevented or substantially prevented.

A first external insulating layer 115B, a second external insulating layer 116B, and an external layer 118B may be on the second thin film transistor CP2-TFT. The first external insulating layer 115B may include a same material as that of the first internal insulating layer 115A, and may be formed concurrently (e.g., simultaneously) with the first internal insulating layer 115A. The second external insulating layer 116B may include a same material as that of the second internal insulating layer 116A, and may be formed concurrently (e.g., simultaneously) with the second internal insulating layer 116A.

The first connecting conductive layer CL1 including the plurality of first holes H1 may be between the first external insulating layer 115B and the second external insulating layer 116B. In an embodiment, the first connecting conductive layer CL1 may extend from the second thin film transistor CP2-TFT to the second voltage wiring portion WP2. The plurality of first holes H1 may act as paths for discharging a gas generated from the first external insulating layer 115B when manufacturing the display device.

The second connecting conductive layer CL2 may be on the second external insulating layer 116B. Also, in an embodiment, the second connecting conductive layer CL2 may extend from the second thin film transistor CP2-TFT to the second voltage wiring portion WP2.

The plurality of second holes H2 may act as paths for discharging a gas generated from the first external insulating layer 115B and/or the second external insulating layer 116B when manufacturing the display device.

In an embodiment, the external layer 118B may include at least one groove VH extending in the first direction (e.g., the y-direction). That is, the external layer 118B may include at least one groove VH that extends corresponding to the virtual boundary line in the non-display area NDA. In this case, the external layer 118B may be partitioned into a plurality of pattern portions by the at least one groove VH. For example, when the external layer 118B includes a first groove VH1 and a second groove VH2, the external layer 118B may be divided into a first pattern portion 118B-1, a second pattern portion 118B-2, and a third pattern portion 118B-3 by the first groove VH1 and the second groove VH2. In an embodiment, the external layer 118B is formed concurrently (e.g., simultaneously) with the pixel defining layer, such that the external layer 118B may be obtained without adding a mask used to manufacture the display device.

The plurality of pattern portions may correspond to the plurality of second holes H2. For example, the first pattern portion 118B-1, the second pattern portion 118B-2, and the third pattern portion 118B-3 may respectively correspond to the second holes H2, that is, may fill the second holes H2. The plurality of pattern portions may prevent or substantially prevent deterioration of a side surface of the second connecting conductive layer CL2, which is exposed by the plurality of second holes H2.

In the embodiment, the valley portion VP may separate the internal layer 118A and the external layer 118B from each other. Also, the valley portion VP may separate the first internal insulating layer 115A from the first external insulating layer 115B and separate the second internal insulating layer 116A from the second external insulating layer 116B. Therefore, moisture or impurities generated from an outer side of the valley portion VP in the non-display area NDA may be prevented or substantially prevented from infiltrating into the display area DA through the organic insulating layer.

In an embodiment, the second voltage wiring portion WP2 may surround the valley portion VP, and the second thin film transistor CP2-TFT may be between the second voltage wiring portion WP2 and the valley portion VP. The second voltage wiring portion WP2 may include a wiring WL. In an embodiment, the first connecting conductive layer CL1 and the second connecting conductive layer CL2 may overlap the wiring WL, and the wiring WL, the first connecting conductive layer CL1, and the second connecting conductive layer CL2 may be electrically connected to one another. Therefore, the first connecting conductive layer CL1 and the second conductive layer CL2 may be configured to transmit the second power voltage ELVSS (see FIG. 5A) applied to the wiring WL.

In an embodiment, the wiring WL may include a same material as that of the drain electrode DE (see FIG. 7) or the source electrode SE (see FIG. 7), and may be concurrently (e.g., simultaneously) formed with the drain electrode DE (see FIG. 7) or the source electrode SE (see FIG. 7).

In an embodiment, the dam portion DAM may prevent or substantially prevent overflow of the organic encapsulation layer 320. Here, the dam portion DAM may include at least one dam. In an embodiment, the dam portion DAM may surround the valley portion VP. That is, the dam portion DAM may be at the outside of the valley portion VP. In an embodiment, the dam portion DAM may at least partially overlap the wiring WL. Therefore, deterioration of an end portion of the wiring WL due to the post-processes may be prevented or substantially prevented.

The dam portion DAM may include at least one of a first portion 115C, a second portion 116C, a third portion 118C, and a fourth portion 119C. In an embodiment, the first portion 115C may include a same material as that of the first internal insulating layer 115A and/or the first external insulating layer 115B, and may be concurrently (e.g., simultaneously) formed with the first internal insulating layer 115A and/or the first external insulating layer 115B. The second portion 116C may include a same material as that of the second internal insulating layer 116A and/or the second external insulating layer 116B, and may be concurrently (e.g., simultaneously) formed with the second internal insulating layer 116A and/or the second external insulating layer 116B. The third portion 118C may include a same material as that of the internal layer 118A and/or the external layer 118B, and may be concurrently (e.g., simultaneously) formed with the internal layer 118A and/or the external layer 118B. The fourth portion 119C may include a same material as that of the spacer 119 (see FIG. 7) and may be concurrently (e.g., simultaneously) formed with the spacer 119 (see FIG. 7).

In an embodiment, a functional layer 212-1 and the opposite electrode 213, the functional layer 212-1 including a first functional layer and a second functional layer, may extend to the non-display area NDA. For example, the functional layer 212-1 and the opposite electrode 213 may cover the internal layer 118A and the valley portion VP and may partially cover the external layer 118B. In another example, the functional layer 212-1 and the opposite electrode 213 may partially cover the internal layer 118A and the valley portion VP. In another example, the functional layer 212-1 and the opposite electrode 213 may be only on the internal layer 118A.

The thin film encapsulation layer TFE sealing the display area may extend to the valley portion VP. In an embodiment, the first inorganic encapsulation layer 310 and the second inorganic encapsulation layer 330 may extend to the dam portion DAM, and the organic encapsulation layer 320 may be filled in the valley portion VP.

An input sensor may be on the thin film encapsulation layer TFE. The input sensor may include a first touch insulating layer 43, touch wires TW, and a second touch insulating layer 45. Here, each of the touch wires TW may be at least one of the first trace lines 415-1 to 415-4 and the second trace lines 425-1 to 425-5 of FIG. 3.

In an embodiment, the first touch insulating layer 43 and the second touch insulating layer 45 may extend to the dam portion DAM of the non-display area NDA, similarly to the first inorganic encapsulation layer 310 and/or the second inorganic encapsulation layer 330. In an embodiment, the touch wires TW may correspond to the first circuit portion or the valley portion VP.

In an embodiment, the at least one groove VH included in the external layer 118B may prevent or substantially prevent overflow of the organic encapsulation layer 320 and check whether the organic encapsulation layer 320 overflows during the manufacturing of the display device. When the organic encapsulation layer 320 is not sufficiently filled in the valley portion VP, some of the touch wires TW may not be at the same plane as that of some other touch wires TW. When the touch wires TW are not at the same plane, characteristics of the input sensor may degrade, and shorts may occur between the touch wires TW. When the organic encapsulation layer 320 completely fills the valley portion VP but overflows towards the dam portion DAM from the valley portion VP, moisture or foreign matter may be introduced into the display area due to the organic encapsulation layer 320, and thereby degrade reliability of the display device. Therefore, it is important to form the organic encapsulation layer 320 with an appropriate amount.

Unlike in the above-described embodiment, if the plurality of island portions IP are on the second circuit portion like on the first circuit portion, it may not check whether the organic encapsulation layer 320 overflows beyond the valley portion VP. However, the at least one groove VH according to an embodiment may extend in the first direction (e.g., the y-direction) on the second circuit portion. Therefore, when the organic encapsulation layer 320 overflows beyond the valley portion VP while being manufactured, the organic encapsulation layer 320 may fill the at least one groove VH. In this case, it may be checked whether the organic encapsulation layer 320 overflows by checking the at least one groove VH. Accordingly, the organic encapsulation layer 320 of an appropriate amount may be obtained, and reliability of the display device may be improved.

In an embodiment, the at least one groove VH may be on the circuit portion CP. Accordingly, an area of the non-display area NDA may be reduced and the display area may be expanded. For example, when the at least one groove VH is not on the circuit portion CP, an area occupied by the non-display area NDA in the display device may be increased. Also, when some of the thin film transistors driving the pixels include the oxide semiconductor, an area occupied by the circuit portion CP in the non-display area NDA may be further increased. In an embodiment, because the at least one groove VH functioning as a dam is on the circuit portion CP, the area of the non-display area NDA may be reduced.

Figure 10:
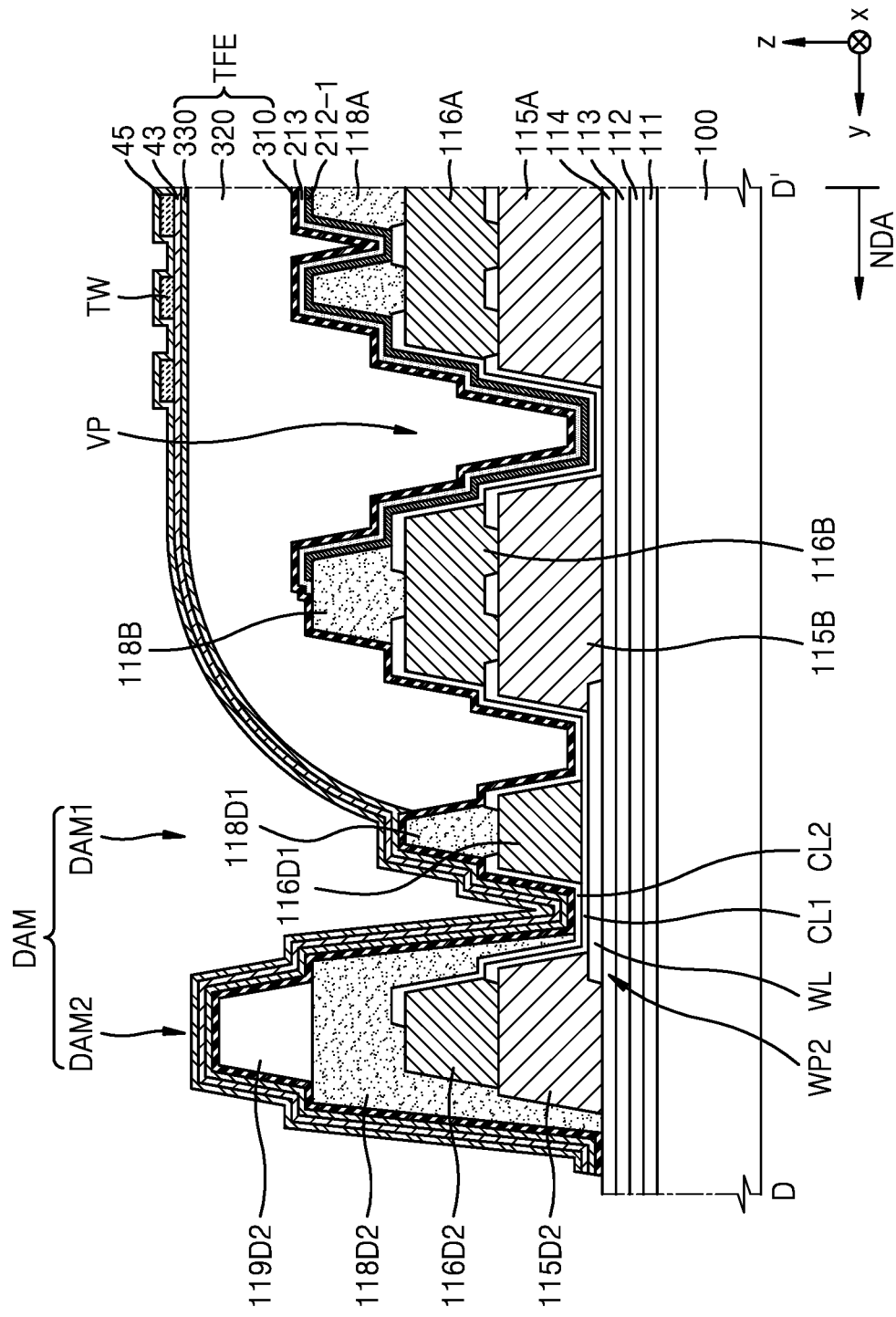
FIG. 10 is a cross-sectional view of the display panel taken along the line D-D' of FIG. 6.

FIG. 10 is a cross-sectional view of the display panel taken along the line D-D' of FIG. 6. In FIG. 10, like reference numerals as those of FIG. 8 or FIG. 9 denote same or like members, and, thus, repeated descriptions thereof are omitted.

Referring to FIG. 10, the valley portion VP, the second voltage wiring portion WP2, and the dam portion DAM may be in the non-display area NDA.

The valley portion VP may separate the internal layer 118A and the external layer 118B from each other. Also, the valley portion VP may separate the first internal insulating layer 115A from the first external insulating layer 115B and separate the second internal insulating layer 116A from the second external insulating layer 116B. Therefore, moisture or impurities generated from an outer side of the valley portion VP in the non-display area NDA may be prevented or substantially prevented from infiltrating into the display area DA.

The first internal insulating layer 115A, the second internal insulating layer 116A, and the internal layer 118A may be stacked on the non-display area NDA, and, in an embodiment, the first circuit portion may not be between the substrate 100 and the first internal insulating layer 115A. The first external insulating layer 115B, the second external insulating layer 116B, and the external layer 118B may be stacked on the non-display area NDA, and, in an embodiment, the second circuit portion may not be between the substrate 100 and the first external insulating layer 115B.

In an embodiment, the dam portion DAM may include a plurality of dams. For example, the dam portion DAM may include a first dam DAM1 and a second dam DAM2 that are provided in parallel with each other. Here, the first dam DAM1 and the second dam DAM2 may extend in the second direction (e.g., the x-direction). In further detail, the first dam DAM1 and the second dam DAM2 may be at an outside of the valley portion VP between the first valley area VA1 (see FIG. 6) and the second valley area VA2 (see FIG. 6). That is, the circuit portion CP (see FIG. 6) may be at an outside of at least one of the first valley area VA1 (see FIG. 6) and the second valley area VA2 (see FIG. 6), and the first dam DAM1 and the second dam DAM2 may be at an outside of at least one of the third valley area VA3 (see FIG. 6) and the fourth valley area VA4 (see FIG. 6). Therefore, in an embodiment, one dam is at the outside of at least one of the first valley area VA1 (see FIG. 6) and the second valley area VA2 (see FIG. 6), and a plurality of dams may be at the outside of at least one of the third valley area VA3 (see FIG. 6) and the fourth valley area VA4 (see FIG. 6). In an embodiment, one dam at the outside of at least one of the first valley area VA1 (see FIG. 6) and the second valley area VA2 (see FIG. 6) may be connected to the plurality of dams at the outside of at least one of the third valley area VA3 (see FIG. 6) and the fourth valley area VA4 (see FIG. 6).

In an embodiment, the first dam DAM1 may include a first internal portion 116D1 and a second internal portion 118D1 on the first internal portion 116D1. The first internal portion 116D1 may include a same material as that of the second internal insulating layer 116A and/or the second external insulating layer 116B, and may be concurrently (e.g., simultaneously) formed with the second internal insulating layer 116A and/or the second external insulating layer 116B. The second internal portion 118D1 may include a same material as that of the internal layer 118A and/or the external layer 118B, and may be concurrently (e.g., simultaneously) formed with the internal layer 118A and/or the external layer 118B.

In an embodiment, the second dam DAM2 may include at least one of a first external portion 115D2, a second external portion 116D2, a third external portion 118D2, and a fourth external portion 119D2. In an embodiment, the first external portion 115D2 may include a same material as that of the first internal insulating layer 115A and/or the first external insulating layer 115B, and may be concurrently (e.g., simultaneously) formed with the first internal insulating layer 115A and/or the first external insulating layer 115B. The second external portion 116D2 may include a same material as that of the second internal insulating layer 116A and/or the second external insulating layer 116B, and may be concurrently (e.g., simultaneously) formed with the second internal insulating layer 116A and/or the second external insulating layer 116B. The third external portion 118D2 may include a same material as that of the internal layer 118A and/or the external layer 118B, and may be concurrently (e.g., simultaneously) formed with the internal layer 118A and/or the external layer 118B. The fourth external portion 119D2 may include a same material as that of the spacer 119 (see FIG. 7) and may be concurrently (e.g., simultaneously) formed with the spacer 119 (see FIG. 7).

The thin film encapsulation layer TFE sealing the display area may extend to the valley portion VP. In an embodiment, the first inorganic encapsulation layer 310 and the second inorganic encapsulation layer 330 may extend to the second dam DAM2. The organic encapsulation layer 320 may be filled in the valley portion VP. In an embodiment, the first touch insulating layer 43 and the second touch insulating layer 45 of the input sensor may extend to the second dam DAM2 of the non-display area NDA, similarly to the first inorganic encapsulation layer 310 or the second inorganic encapsulation layer 330.

Figure 11:
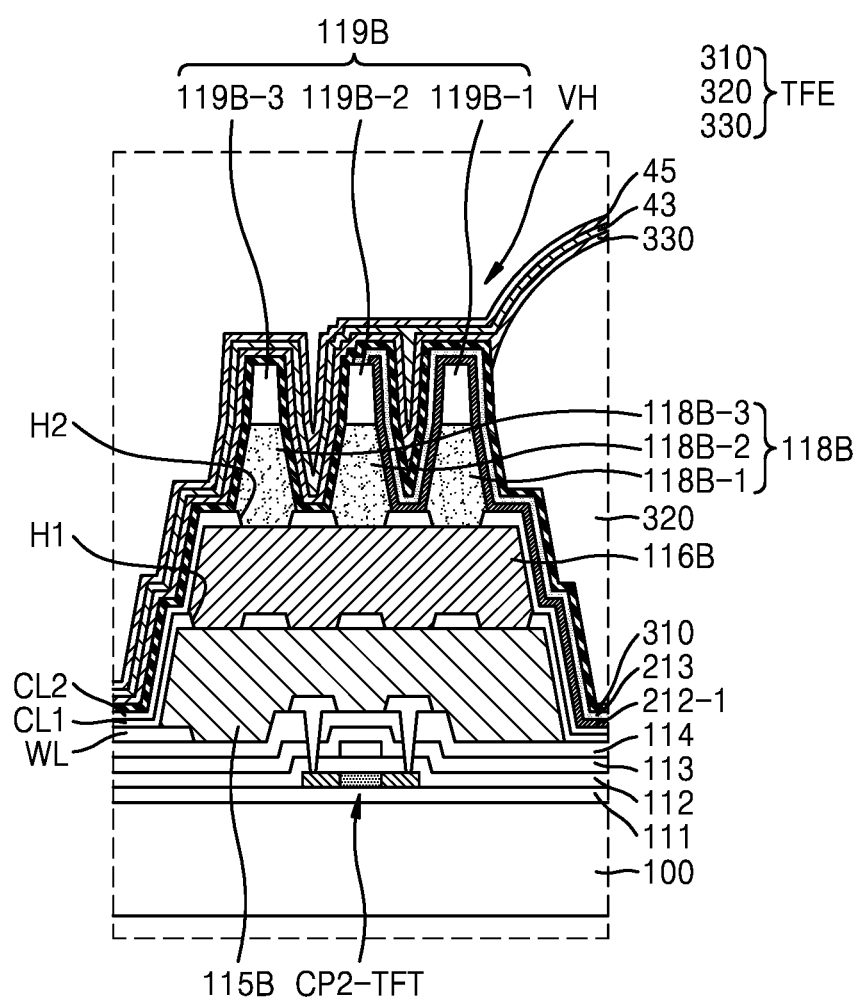
FIG. 11 is a partial cross-sectional view showing a non-display area according to another embodiment.

FIG. 11 is a partial cross-sectional view showing the non-display area NDA according to another embodiment.

Referring to FIG. 11, the display panel may include a substrate including a display area and a non-display area, a circuit portion on the non-display area, the circuit portion including a first circuit portion and a second circuit portion, a valley portion separating the first circuit portion and the second circuit portion from each other, and the thin film encapsulation layer TFE extending from the display area to the valley portion.

The second circuit portion may include at least one second thin film transistor CP2-TFT, and the external layer 118B including at least one groove VH extending in the first direction may be on the second thin film transistor CP2-TFT. In an embodiment, the external layer 118B may include a same material as that of the pixel defining layer.

In an embodiment, an upper external layer 119B may be on the external layer 118B. In an embodiment, the upper external layer 119B may include a same material as that of the spacer 119 (see FIG. 7) and may be concurrently (e.g., simultaneously) formed with the spacer 119 (see FIG. 7).

The upper external layer 119B may include a plurality of upper pattern portions that are apart from one another. For example, the upper external layer 119B may include a first upper pattern portion 119B-1, a second upper pattern portion 119B-2, and a third upper pattern portion 119B-3 that are apart from one another. Here, the first upper pattern portion 119B-1, the second upper pattern portion 119B-2, and the third upper pattern portion 119B-3 may be respectively on the first pattern portion 118B-1, the second pattern portion 118B-2, and the third pattern portion 118B-3.

In an embodiment, because the upper external layer 119B may be further provided on the external layer 118B, the at least one groove VH may have a greater depth.

Figure 12:
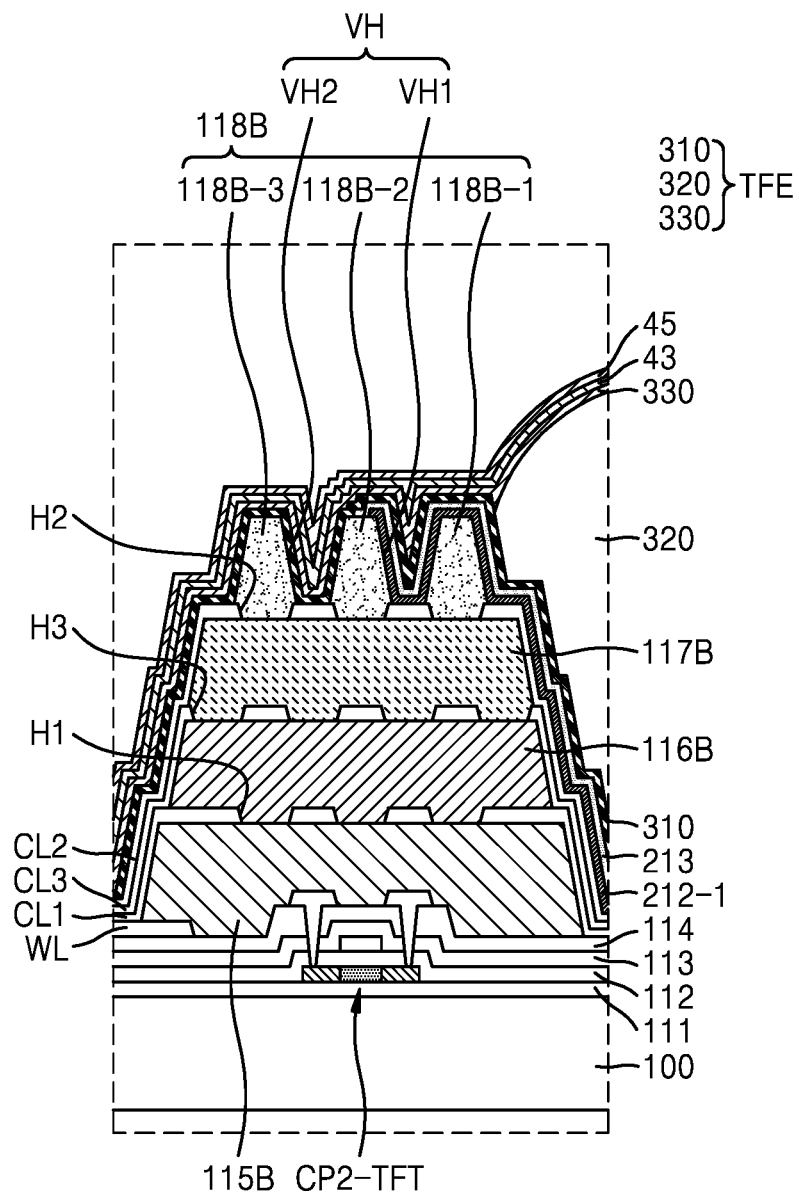
FIG. 12 is a partial cross-sectional view showing a non-display area according to another embodiment.
Figure 13:
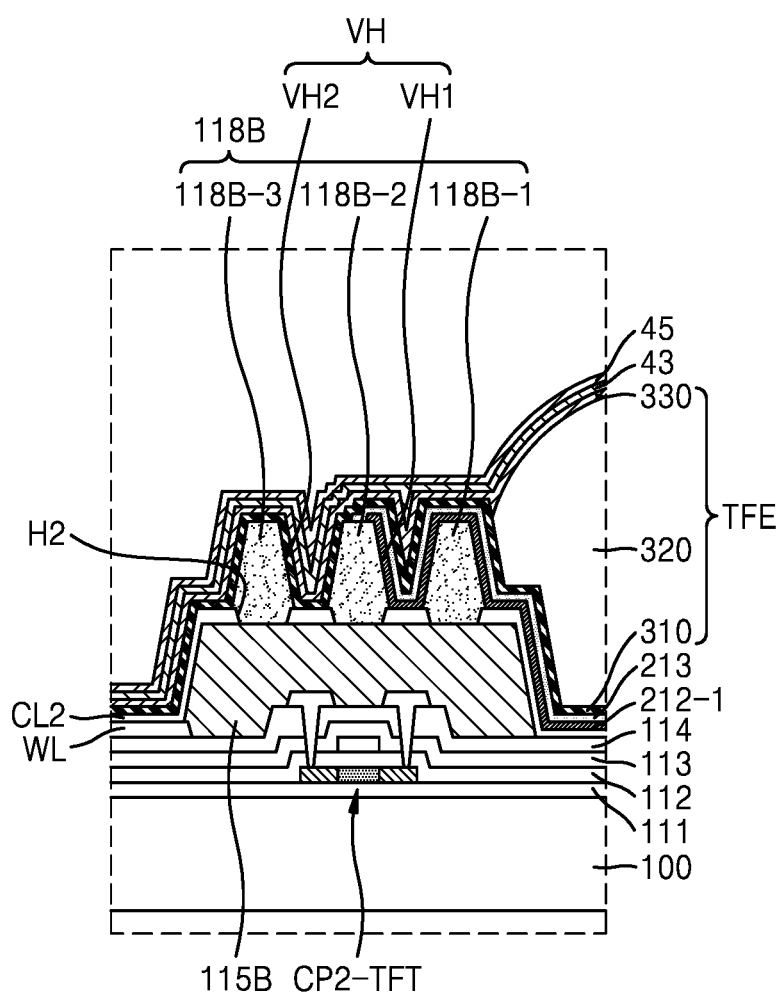
FIG. 13 is a partial cross-sectional view showing a non-display area according to another embodiment.

FIG. 12 is a partial cross-sectional view showing the non-display area NDA according to another embodiment; and FIG. 13 is a partial cross-sectional view showing the non-display area NDA according to another embodiment.

Referring to FIGS. 12 and 13, the display panel may include a substrate including a display area and a non-display area, a circuit portion on the non-display area, the circuit portion including a first circuit portion and a second circuit portion, a valley portion separating the first circuit portion and the second circuit portion from each other, and the thin film encapsulation layer TFE extending from the display area to the valley portion.

The second circuit portion may include at least one second thin film transistor CP2-TFT, and the external layer 118B including at least one groove VH extending in the first direction may be on the second thin film transistor CP2-TFT. In an embodiment, the external layer 118B may include a same material as that of the pixel defining layer.

Referring to FIG. 12, in an embodiment, a third external insulating layer 117B may be further provided between the second external insulating layer 116B and the external layer 118B. The third external insulating layer 117B may include an organic insulating layer. In an embodiment, the third external insulating layer 117B may include a general-purpose polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof.

A third connecting conductive layer CL3 including a plurality of third holes H3 may be between the third external insulating layer 117B and the second external insulating layer 116B. In an embodiment, the third connecting conductive layer CL3 may extend from the first thin film transistor to the second thin film transistor CP2-TFT. The third connecting conductive layer CL3 may include a highly conductive material. The third connecting conductive layer CL3 may include a conductive material including molybdenum (Mo), aluminum (Al), copper (Cu), titanium (Ti), etc., and may have a single-layered or multi-layered structure. In an embodiment, the third connecting conductive layer CL3 may have a multi-layered structure including Ti/Al/Ti. The plurality of third holes H3 may act as paths for discharging a gas generated from the second external insulating layer 116B when manufacturing the display device. In some embodiments, the third connecting conductive layer CL3 may be omitted.

Referring to FIG. 13, the first external insulating layer 115B may be between the second thin film transistor CP2-TFT and the external layer 118B. As compared with the embodiment shown in FIG. 8, the second external insulating layer 116B and the first connecting conductive layer CL1 may be omitted. As described above, the organic insulating layers may be stacked on the second thin film transistor CP2-TFT in various manners.

Figure 14:
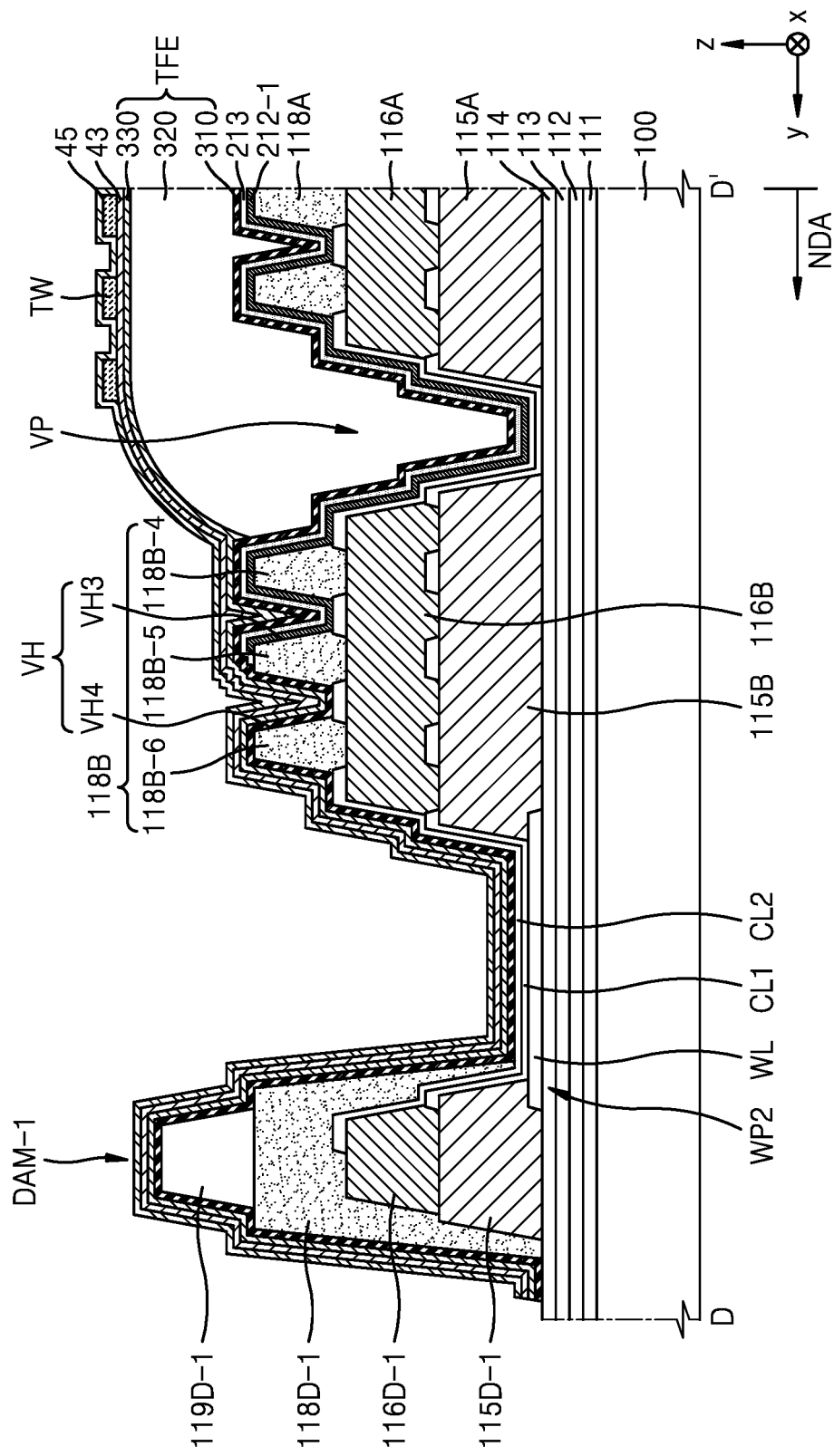
FIG. 14 is a cross-sectional view of a display panel according to another embodiment, taken along the line D-D' of FIG. 6.

FIG. 14 is a cross-sectional view of a display panel according to another embodiment, taken along the line D-D' of FIG. 6. In FIG. 14, like reference numerals as those of FIG. 10 denote same or like members, and, thus, repeated descriptions thereof are omitted.

Referring to FIG. 14, the display panel may include a substrate including a display area and a non-display area, a circuit portion on the non-display area, the circuit portion including a first circuit portion and a second circuit portion, a valley portion separating the first circuit portion and the second circuit portion from each other, and the thin film encapsulation layer TFE extending from the display area to the valley portion.

The second circuit portion may include at least one second thin film transistor CP2-TFT, and the external layer 118B including at least one groove VH extending in the first direction may be on the second thin film transistor CP2-TFT. In an embodiment, the external layer 118B may include a same material as that of the pixel defining layer.

The valley portion VP may separate the internal layer 118A and the external layer 118B from each other. Also, the valley portion VP may separate the first internal insulating layer 115A from the first external insulating layer 115B and separate the second internal insulating layer 116A from the second external insulating layer 116B. Therefore, moisture or impurities generated from an outer side of the valley portion VP in the non-display area NDA may be prevented or substantially prevented from infiltrating into the display area DA.

The first internal insulating layer 115A, the second internal insulating layer 116A, and the internal layer 118A may be stacked on the non-display area NDA, and, in an embodiment, the first circuit portion may not be between the substrate 100 and the first internal insulating layer 115A. The first external insulating layer 115B, the second external insulating layer 116B, and the external layer 118B may be stacked on the non-display area NDA, and, in an embodiment, the second circuit portion may not be between the substrate 100 and the first external insulating layer 115B.

In an embodiment, the at least one groove VH of the external layer 118B may surround the valley portion VP. In further detail, the at least one groove VH of the external layer 118B may extend in the second direction (e.g., the x-direction). That is, the at least one groove VH of the external layer 118B may be at the outside of the third valley area VA3 (see FIG. 6). In an embodiment, the external layer 118B may be partitioned into a plurality of pattern portions by the at least one groove VH. For example, when the external layer 118B includes a third groove VH3 and a fourth groove VH4, the external layer 118B may be divided into a fourth pattern portion 118B-4, a fifth pattern portion 118B-5, and a sixth pattern portion 118B-6 by the third groove VH3 and the fourth groove VH4. In this case, the third groove VH3, the fourth groove VH4, the fourth pattern portion 118B-4, the fifth pattern portion 118B-5, and the sixth pattern portion 118B-6 shown in FIG. 14 are respectively similar to the first groove VH1, the second groove VH2, the first pattern portion 118B-1, the second pattern portion 118-B, and the third pattern portion 118B-3 of FIG. 8, and, thus, repeated descriptions thereof are omitted.

In an embodiment, a dam portion DAM-1 may include at least one of a first portion 115D-1, a second portion 116D-1, a third portion 118D-1, and a fourth portion 119D-1. In this case, the dam portion DAM-1, the first portion 115D-1, the second portion 116D-1, the third portion 118D-1, and the fourth portion 119D-1 are similar to the dam portion DAM, the first portion 115C, the second portion 116C, the third portion 118C, and the fourth portion 119C shown in FIG. 8, and, thus, repeated descriptions thereof are omitted.

In an embodiment, the external layer 118B may include at least one groove VH in the region where the circuit portion is not provided. In this case, the dam portion DAM-1 may be provided as one dam, and the non-display area NDA may be reduced.

As described above, according to one or more embodiments, the at least one groove extending in the first direction is provided in the non-display area to prevent or check overflow of the organic encapsulation layer.

Also, the at least one groove is on the circuit portion to reduce the non-display area and increase the display area.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display device comprising:
   a substrate comprising a display area and a non-display area;
   a circuit portion on the non-display area, the circuit portion comprising a first circuit portion and a second circuit portion;
   a valley portion separating the first circuit portion and the second circuit portion from each other; and
   a thin film encapsulation layer sealing the display area,
   wherein the first circuit portion is between the valley portion and the display area, and the second circuit portion is at an outside of the valley portion and comprises at least one thin film transistor,
   an internal layer on the first circuit portion comprises a plurality of grooves extending in each of a first direction and a second direction crossing the first direction, and a plurality of island portions comprising respective upper surfaces that are apart from one another in the first direction and the second direction, and
   the first direction and the second direction are parallel to a main surface of the substrate.

2. The display device of claim 1, wherein an external layer on the second circuit portion comprises a plurality of grooves extending in the first direction and separated from one another in the second direction.

3. The display device of claim 2, further comprising:
   display elements on the display area and comprising a pixel electrode and an opposite electrode; and
   a connecting conductive layer comprising a same material as a material of the pixel electrode and extending from the first circuit portion to the second circuit portion, and the connecting conductive layer comprises a plurality of holes.

4. The display device of claim 3, wherein the external layer covers the plurality of holes.

5. The display device of claim 3, wherein the external layer is divided into a plurality of pattern portions by the plurality of grooves of the external layer, and the plurality of pattern portions covers the plurality of holes.

6. The display device of claim 3, wherein the external layer comprises a same material as a material of a pixel defining layer, the pixel defining layer defining an emission area of the display elements and covering edges of the pixel electrode, and
   an upper external layer is located on the external layer.

7. The display device of claim 2, wherein the internal layer and the external layer are separated from each other by the valley portion.

8. The display device of claim 2, wherein a first external insulating layer is between the second circuit portion and the external layer.

9. The display device of claim 2, wherein the plurality of grooves of the external layer surrounds the valley portion.

10. The display device of claim 1, further comprising a dam portion around the valley portion.

11. The display device of claim 10, wherein the dam portion comprises a plurality of dams, and
    the plurality of dams extend in the second direction.

12. A display device comprising:
    a substrate comprising a display area and a non-display area;
    a circuit portion on the non-display area, the circuit portion comprising a first circuit portion and a second circuit portion;
    a valley portion separating the first circuit portion and the second circuit portion from each other; and
    a thin film encapsulation layer sealing the display area,
    wherein the first circuit portion is between the valley portion and the display area, and the second circuit portion is at an outside of the valley portion,
    an internal layer on the first circuit portion comprises a plurality of grooves extending in each of a first direction and a second direction crossing the first direction, and a plurality of island portions comprising respective upper surfaces that are apart from one another in the first direction and the second direction,
    an external layer on the second circuit portion comprises a plurality of grooves extending in the first direction and separated from one another in the second direction,
    a first external insulating layer is between the second circuit portion and the external layer,
    a second external insulating layer is between the first external insulating layer and the external layer, and
    the first direction and the second direction are parallel to a main surface of the substrate.

13. The display device of claim 12, wherein a third external insulating layer is between the second external insulating layer and the external layer.

14. A display device comprising:
    a substrate comprising a display area and a non-display area;
    a valley portion around the display area in the non-display area, the valley portion comprising a first valley area and a second valley area facing each other;
    a first circuit portion at an inside of at least one of the first valley area and the second valley area, the first circuit portion extending in a first direction and comprising at least one thin film transistor;
    a second circuit portion at an outside of at least one of the first valley area and the second valley area, the second circuit portion extending in the first direction and comprising at least one thin film transistor;
    an internal layer on the first circuit portion and comprising a plurality of grooves extending in each of the first direction and a second direction crossing the first direction, and a plurality of island portions comprising respective upper surfaces that are apart from one another in the first direction and the second direction;

a plurality of dams at an outside of the valley portion between the first valley area and the second valley area of the valley portion along the second direction, the plurality of dams extending in the second direction; and a thin film encapsulation layer sealing the display area, the thin film encapsulation layer extending to the non-display area, and the first direction and the second direction are parallel to a main surface of the substrate.

15. The display device of claim 14, further comprising: an external layer comprising a plurality of grooves extending in the first direction on the second circuit portion and separated from one another in the second direction.

16. The display device of claim 15, further comprising:
display elements on the display area and comprising a pixel electrode and an opposite electrode; and a connecting conductive layer on at least one of the first circuit portion and the second circuit portion and comprising a same material as a material of the pixel electrode, and the connecting conductive layer comprises a plurality of holes.

17. The display device of claim 16, wherein the external layer covers the plurality of holes.

18. The display device of claim 16, wherein the external layer is divided into a plurality of pattern portions by the plurality of grooves of the external layer.

19. The display device of claim 18, wherein the plurality of pattern portions covers the plurality of holes.

* * * * *